(12) United States Patent
Goktepeli et al.

(10) Patent No.: US 9,780,210 B1
(45) Date of Patent: Oct. 3, 2017

(54) BACKSIDE SEMICONDUCTOR GROWTH

(71) Applicant: QUALCOMM Incorporated, San Diego, CA (US)

(72) Inventors: Sinan Goktepeli, San Diego, CA (US); Richard Hammond, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 15/234,889

(22) Filed: Aug. 11, 2016

(51) Int. Cl.
| | |
|---|---|
| *H01L 29/78* | (2006.01) |
| *H01L 29/66* | (2006.01) |
| *H01L 21/74* | (2006.01) |
| *H01L 29/06* | (2006.01) |
| *H01L 29/08* | (2006.01) |
| *H01L 23/528* | (2006.01) |
| *H01L 23/66* | (2006.01) |
| *H01L 21/265* | (2006.01) |
| *H01L 21/324* | (2006.01) |
| *H01L 21/285* | (2006.01) |
| *H01L 29/161* | (2006.01) |
| *H01L 29/16* | (2006.01) |
| *H01L 29/165* | (2006.01) |
| *H04B 1/40* | (2015.01) |

(52) U.S. Cl.
CPC ...... *H01L 29/7838* (2013.01); *H01L 21/2652* (2013.01); *H01L 21/28518* (2013.01); *H01L 21/324* (2013.01); *H01L 23/528* (2013.01); *H01L 23/66* (2013.01); *H01L 29/0649* (2013.01); *H01L 29/0847* (2013.01); *H01L 29/161* (2013.01); *H01L 29/165* (2013.01); *H01L 29/1608* (2013.01); *H01L 29/66651* (2013.01); *H01L 29/7848* (2013.01); *H04B 1/40* (2013.01); *H01L 29/665* (2013.01); *H01L 2223/6677* (2013.01)

(58) Field of Classification Search
CPC ............ H01L 29/7838; H01L 29/0649; H01L 29/0847; H01L 29/1608; H01L 29/161; H01L 29/165; H01L 21/2652; H01L 21/28518; H01L 21/324; H01L 29/66477; H01L 29/66636; H01L 21/743
See application file for complete search history.

(56) References Cited

U.S. PATENT DOCUMENTS

| | | | |
|---|---|---|---|
| 7,666,723 B2 | 2/2010 | Frank et al. | |
| 7,816,231 B2 | 10/2010 | Dyer et al. | |
| 8,552,487 B2 | 10/2013 | Doris et al. | |
| 8,772,874 B2 * | 7/2014 | Cheng ............... | H01L 29/66803 257/347 |

(Continued)

*Primary Examiner* — Christine Enad
(74) *Attorney, Agent, or Firm* — Seyfarth Shaw LLP

(57) ABSTRACT

An integrated circuit structure may include a transistor on a front-side semiconductor layer supported by an isolation layer. The transistor is a first source/drain/body region. The integrated circuit structure may also include a raised source/drain/body region coupled to a backside of the first source/drain/body region of the transistor. The transistor is a raised source/drain/body region extending from the backside of the first source/drain/body region toward a backside dielectric layer supporting the isolation layer. The integrated circuit structure may further include a backside metallization coupled to the raised source/drain/body region.

30 Claims, 26 Drawing Sheets

(56) References Cited

U.S. PATENT DOCUMENTS

| | | | |
|---|---|---|---|
| 8,872,274 B2 | 10/2014 | Cohen et al. | |
| 8,946,007 B2 * | 2/2015 | Doris | H01L 29/66477 |
| | | | 257/192 |
| 9,023,688 B1 * | 5/2015 | Or-Bach | H01L 23/3677 |
| | | | 257/E21.532 |
| 2008/0206977 A1 * | 8/2008 | Frank | H01L 21/768 |
| | | | 438/597 |
| 2014/0367753 A1 | 12/2014 | Huang et al. | |

* cited by examiner

BACKSIDE SEMICONDUCTOR GROWTH

TECHNICAL FIELD

The present disclosure generally relates to integrated circuits (ICs). More specifically, the present disclosure relates to a method and apparatus for backside semiconductor growth.

BACKGROUND

Mobile radio frequency (RF) chip designs (e.g., mobile RF transceivers), including high performance diplexers have migrated to a deep sub-micron process node due to cost and power consumption considerations. The design of such mobile RF transceivers becomes complex at this deep sub-micron process node. The design complexity of these mobile RF transceivers is further complicated by added circuit functions to support communication enhancements, such as carrier aggregation. Further design challenges for mobile RF transceivers include analog/RF performance considerations, including mismatch, noise and other performance considerations. The design of these mobile RF transceivers includes the use of additional passive devices, for example, to suppress resonance, and/or to perform filtering, bypassing and coupling.

The design of these mobile RF transceivers may include the use of silicon on insulator (SOI) technology. SOI technology replaces conventional silicon substrates with a layered silicon-insulator-silicon substrate to reduce parasitic device capacitance and improve performance. SOI-based devices differ from conventional, silicon-built devices because the silicon junction is above an electrical isolator, typically a buried oxide (BOX) layer. A reduced thickness BOX layer, however, may not sufficiently reduce the parasitic capacitance caused by the proximity of an active device on the silicon layer and a substrate supporting the BOX layer.

The active devices on the SOI layer may include complementary metal oxide semiconductor (CMOS) transistors. Unfortunately, successful fabrication of transistors using SOI technology may involve the use of raised source/drain regions. Conventionally, a raised source/drain is specified to enable contact between the raised source/drain region and subsequent metallization layers. In addition, a raised source/drain region provides a channel for carriers to travel. As a result, conventional transistors having raised source/drain regions generally suffer from the raised source/drain region problem. The source/drain region problem is characterized by unwanted, parasitic capacitance in the form of fringe capacitance and overlap capacitance between a gate and the source/drain regions of a transistor.

SUMMARY

An integrated circuit structure may include a transistor on a front-side semiconductor layer supported by an isolation layer. The transistor includes a first source/drain/body region. The integrated circuit structure may also include a raised source/drain/body region coupled to a backside of the first source/drain/body region of the transistor. The raised source/drain/body region may extend from the backside of the first source/drain/body region toward a backside dielectric layer supporting the isolation layer. The integrated circuit structure may further include a backside metallization coupled to the raised source/drain/body region.

A method of constructing an integrated circuit structure may include fabricating a transistor using a front-side semiconductor layer supported by an isolation layer. The transistor includes a first source/drain/body region. The method may also include exposing a backside of the first source/drain/body region. The method may further include fabricating a raised source/drain/body region coupled to the backside of the first source/drain/body region of the transistor. The raised source/drain/body region may extend from the backside of the first source/drain/body region toward a first backside dielectric layer supporting the isolation layer. The method may also include fabricating a backside metallization coupled to the raised source/drain/body region.

An integrated circuit structure may include a transistor on a front-side semiconductor layer supported by an isolation layer. The transistor includes a first source/drain/body region. The integrated circuit structure may also include a means for extending a backside of the first source/drain/body region of the transistor from the isolation layer toward a backside dielectric layer supporting the isolation layer. The integrated circuit structure may further include a backside metallization coupled to the backside of first source/drain/body region through the extending means.

A radio frequency (RF) front end module may include an integrated RF circuit structure. The integrated RF circuit structure may include a switch transistor on a front-side semiconductor layer supported by an isolation layer. The switch transistor includes a first source/drain/body region and a raised source/drain/body region coupled to a backside of the first source/drain/body region of the switch transistor. The raised source/drain/body region extends from the backside of the first source/drain/body region toward a backside dielectric layer supporting the isolation layer. The switch transistor also includes a backside metallization coupled to the raised source/drain/body region. The RF front end module may further include an antenna coupled to an output of the switch transistor.

This has outlined, rather broadly, the features and technical advantages of the present disclosure in order that the detailed description that follows may be better understood. Additional features and advantages of the disclosure will be described below. It should be appreciated by those skilled in the art that this disclosure may be readily utilized as a basis for modifying or designing other structures for carrying out the same purposes of the present disclosure. It should also be realized by those skilled in the art that such equivalent constructions do not depart from the teachings of the disclosure as set forth in the appended claims. The novel features, which are believed to be characteristic of the disclosure, both as to its organization and method of operation, together with further objects and advantages, will be better understood from the following description when considered in connection with the accompanying figures. It is to be expressly understood, however, that each of the figures is provided for the purpose of illustration and description only and is not intended as a definition of the limits of the present disclosure.

BRIEF DESCRIPTION OF THE DRAWINGS

For a more complete understanding of the present disclosure, reference is now made to the following description taken in conjunction with the accompanying drawings.

DETAILED DESCRIPTION

Figure 1A:
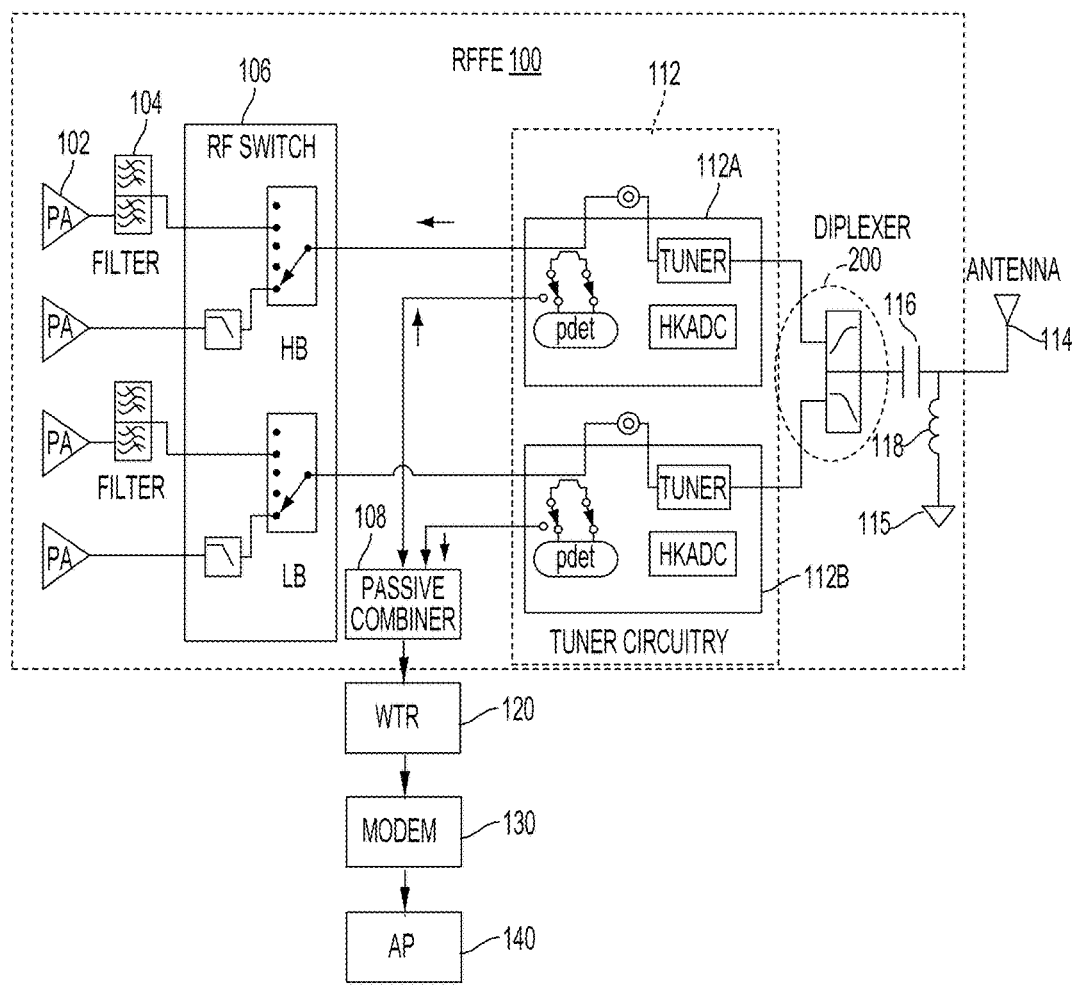
FIG. 1A is a schematic diagram of a radio frequency (RF) front end (RFFE) module employing a diplexer according to an aspect of the present disclosure.

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. It will be apparent to those skilled in the art, however, that these concepts may be practiced without these specific details. In some instances, well-known structures and components are shown in block diagram form in order to avoid obscuring such concepts. As described herein, the use of the term "and/or" is intended to represent an "inclusive OR", and the use of the term "or" is intended to represent an "exclusive OR".

Mobile radio frequency (RF) chip designs (e.g., mobile RF transceivers) have migrated to a deep sub-micron process node due to cost and power consumption considerations. The design complexity of mobile RF transceivers is further complicated by added circuit functions to support communication enhancements, such as carrier aggregation. Further design challenges for mobile RF transceivers include analog/RF performance considerations, including mismatch, noise and other performance considerations. The design of these mobile RF transceivers includes the use of passive devices, for example, to suppress resonance, and/or to perform filtering, bypassing and coupling.

Successful fabrication of modern semiconductor chip products involves interplay between the materials and the processes employed. In particular, the formation of conductive material plating for semiconductor fabrication in back-end-of-line (BEOL) processes is an increasingly challenging part of the process flow. This is particularly true in terms of maintaining a small feature size. The same challenge of maintaining a small feature size also applies to passive on glass (POG) technology, where high performance components such as inductors and capacitors are built upon a highly insulative substrate that may also have a very low loss to support mobile RF transceiver design.

The design of these mobile RF transceivers may include the use of silicon on insulator (SOI) technology. SOI technology replaces conventional silicon substrates with layered silicon-insulator-silicon substrates to reduce parasitic device capacitance and improve performance. SOI-based devices differ from conventional, silicon-built devices because the silicon junction is above an electrical isolator, typically a buried oxide (BOX) layer, in which a thickness of the BOX layer may be reduced. A reduced thickness BOX layer, however, may not sufficiently reduce the parasitic capacitance caused by the proximity of an active device on the silicon layer and a substrate supporting the BOX layer. In addition, the active devices on an SOI layer may include complementary metal oxide semiconductor (CMOS) transistor.

Unfortunately, successful fabrication of transistors using SOI technology may involve the use of raised source/drain regions. Conventionally, a raised source/drain enables contact between the raised source/drain region and subsequent metallization layers. In addition, a raised source/drain region provides a channel for carriers to travel. Conventional transistors with raised source/drain regions generally suffer from the raised source/drain region problem. The raised source/drain region problem is characterized by unwanted, parasitic capacitance in the form of fringe capacitance and overlap capacitance between a gate and the source/drain regions. In addition, conventional CMOS technology is limited to epitaxial growth on the front-side of the active devices. As a result, aspects of the present disclosure include a post-layer transfer process to enable backside semiconductor deposition/growth to eliminate the raised source/drain region problem.

Various aspects of the disclosure provide techniques for integrated circuit structures including transistors having backside extended (raised) source/drain/body regions. The process flow for semiconductor fabrication of the integrated circuit structure may include front-end-of-line (FEOL) processes, middle-of-line (MOL) (also referred to as middle end of line (MEOL)) processes, and back-end-of-line (BEOL) processes. The front-end-of-line processes may include the set of process steps that form the active devices, such as transistors, capacitors, diodes. The FEOL processes include ion implantation, anneals, oxidation, chemical vapor deposition (CVD) or atomic layer deposition (ALD), etching, chemical mechanical polishing (CMP), epitaxy. The middle-of-line processes may include the set of process steps that enable connection of the transistors to BEOL interconnect. These steps include silicidation and contact formation as well as stress introduction. The back-end-of-line processes may include the set of process steps that form the interconnect that ties the independent transistors and form circuits. Currently, copper and aluminum provide the interconnects, but with further development of the technology other conductive material may be used.

It will be understood that the term "layer" includes film and is not to be construed as indicating a vertical or horizontal thickness unless otherwise stated. As described herein, the term "substrate" may refer to a substrate of a diced wafer or may refer to a substrate of a wafer that is not diced. Similarly, the terms chip and die may be used interchangeably unless such interchanging would tax credulity.

Aspects of the present disclosure describe integrated circuit structures including transistors having backside raised source/drain/body regions that may be used as antenna switch transistors in integrated radio frequency (RF) circuit structures for high quality (Q)-factor RF applications. In one configuration, a post layer-transfer process forms the backside raised source/drain/body regions of a transistor. The post-layer transfer process may form a backside semiconductor layer on a backside of the source/drain regions of a transistor. The backside semiconductor layer may extend from a first surface to a second surface of an isolation layer, in which the first surface of the isolation layer supports the transistor.

In this configuration, the post-layer transfer process may include a post-layer deposition process or a post-layer growth process for forming the backside semiconductor layers on the backside of the source/drain regions of the transistor. The raised source/drain/body region is composed of an epitaxially grown, backside semiconductor material. Alternatively, the raised source/drain region may be formed using chemical vapor deposition (CVD), atomic layer deposition (ALD), or other like front-end-of-line fabrication process. In this configuration, the backside raised source/drain regions of the transistor may reduce the parasitic capacitance associated with front-side raised source/drain regions fabricated using conventional CMOS processes. That is, extension of the source/drain regions into a backside of the transistor helps prevent the formation of parasitic capacitance between the body of the transistor and conventional front-side raised source/drain regions.

One goal driving the wireless communication industry is providing consumers with increased bandwidth. The use of carrier aggregation in current generation communications provides one possible solution for achieving this goal. Carrier aggregation enables a wireless carrier, having licenses to two frequency bands (e.g., 700 MHz and 2 GHz) in a particular geographic area, to maximize bandwidth by simultaneously using both frequencies for a single communication stream. While an increased amount of data is provided to the end user, carrier aggregation implementation is complicated by noise created at the harmonic frequencies due to the frequencies used for data transmission. For example, 700 MHz transmissions may create harmonics at 2.1 GHz, which interfere with data broadcast at 2 GHz frequencies.

For wireless communication, passive devices are used to process signals in a carrier aggregation system. In carrier aggregation systems, signals are communicated with both high band and low band frequencies. In a chipset, a passive device (e.g., a diplexer) is usually inserted between an antenna and a tuner (or a radio frequency (RF) switch) to ensure high performance. Usually, a diplexer design includes inductors and capacitors. Diplexers can attain high performance by using inductors and capacitors that have a high quality (Q)-factor. High performance diplexers can also be attained by reducing the electromagnetic coupling between components, which may be achieved through an arrangement of the geometry and direction of the components.

FIG. 1A is a schematic diagram of a radio frequency (RF) front end (RFFE) module 100 employing a diplexer 200 according to an aspect of the present disclosure. The RF front end module 100 includes power amplifiers 102, duplexer/filters 104, and a radio frequency (RF) switch module 106. The power amplifiers 102 amplify signal(s) to a certain power level for transmission. The duplexer/filters 104 filter the input/output signals according to a variety of different parameters, including frequency, insertion loss, rejection or other like parameters. In addition, the RF switch module 106 may select certain portions of the input signals to pass on to the rest of the RF front end module 100.

The RF front end module 100 also includes tuner circuitry 112 (e.g., first tuner circuitry 112A and second tuner circuitry 112B), the diplexer 200, a capacitor 116, an inductor 118, a ground terminal 115 and an antenna 114. The tuner circuitry 112 (e.g., the first tuner circuitry 112A and the second tuner circuitry 112B) includes components such as a tuner, a portable data entry terminal (PDET), and a house keeping analog to digital converter (HKADC). The tuner circuitry 112 may perform impedance tuning (e.g., a voltage standing wave ratio (VSWR) optimization) for the antenna 114. The RF front end module 100 also includes a passive combiner 108 coupled to a wireless transceiver (WTR) 120. The passive combiner 108 combines the detected power from the first tuner circuitry 112A and the second tuner circuitry 112B. The wireless transceiver 120 processes the information from the passive combiner 108 and provides this information to a modem 130 (e.g., a mobile station modem (MSM)). The modem 130 provides a digital signal to an application processor (AP) 140.

As shown in FIG. 1A, the diplexer 200 is between the tuner component of the tuner circuitry 112 and the capacitor 116, the inductor 118, and the antenna 114. The diplexer 200 may be placed between the antenna 114 and the tuner circuitry 112 to provide high system performance from the RF front end module 100 to a chipset including the wireless transceiver 120, the modem 130 and the application processor 140. The diplexer 200 also performs frequency domain multiplexing on both high band frequencies and low band frequencies. After the diplexer 200 performs its frequency multiplexing functions on the input signals, the output of the diplexer 200 is fed to an optional LC (inductor/capacitor) network including the capacitor 116 and the inductor 118. The LC network may provide extra impedance matching components for the antenna 114, when desired. Then a signal with the particular frequency is transmitted or received by the antenna 114. Although a single capacitor and inductor are shown, multiple components are also contemplated.

Figure 1B:
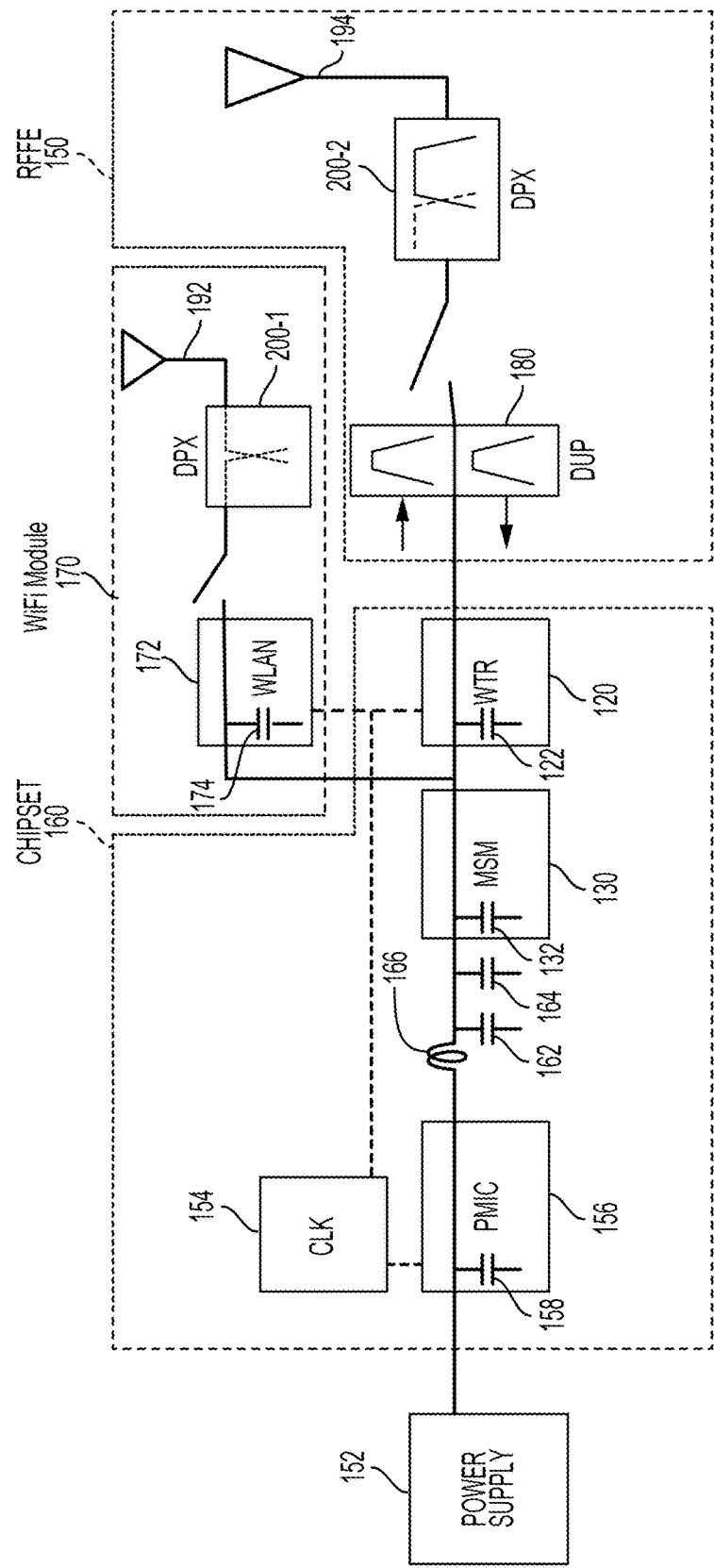
FIG. 1B is a schematic diagram of a radio frequency (RF) front end (RFFE) module employing diplexers for a chipset to provide carrier aggregation according to aspects of the present disclosure.

FIG. 1B is a schematic diagram of a wireless local area network (WLAN) (e.g., WiFi) module 170 including a first diplexer 200-1 and an RF front end module 150 including a second diplexer 200-2 for a chipset 160 to provide carrier aggregation according to an aspect of the present disclosure. The WiFi module 170 includes the first diplexer 200-1 communicably coupling an antenna 192 to a wireless local area network module (e.g., WLAN module 172). The RF front end module 150 includes the second diplexer 200-2 communicably coupling an antenna 194 to the wireless transceiver (WTR) 120 through a duplexer 180. The wireless transceiver 120 and the WLAN module 172 of the WiFi module 170 are coupled to a modem (MSM, e.g., baseband modem) 130 that is powered by a power supply 152 through a power management integrated circuit (PMIC) 156. The chipset 160 also includes capacitors 162 and 164, as well as an inductor(s) 166 to provide signal integrity. The PMIC 156, the modem 130, the wireless transceiver 120, and the WLAN module 172 each include capacitors (e.g., 158, 132, 122, and 174) and operate according to a clock 154. The geometry and arrangement of the various inductor and capacitor components in the chipset 160 may reduce the electromagnetic coupling between the components.

Figure 2A:
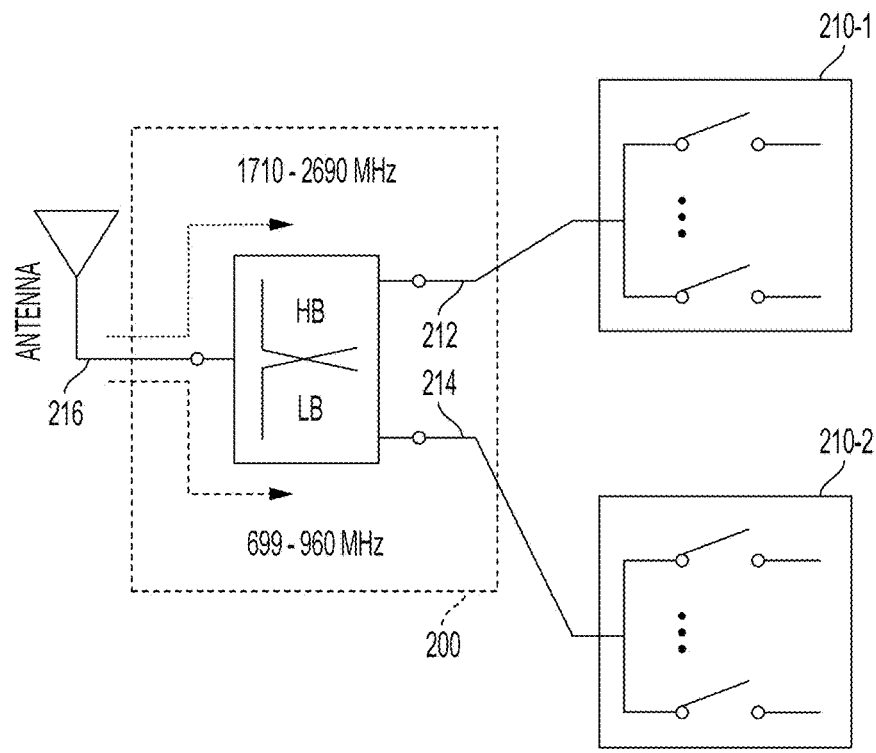
FIG. 2A is a diagram of a diplexer design according to an aspect of the present disclosure.

FIG. 2A is a diagram of a diplexer 200 according to an aspect of the present disclosure. The diplexer 200 includes a high band (FIB) input port 212, a low band (LB) input port 214, and an antenna 216. A high band path of the diplexer 200 includes a high band antenna switch 210-1. A low band path of the diplexer 200 includes a low band antenna switch 210-2. A wireless device including an RF front end module may use the antenna switches 210 and the diplexer 200 to enable a wide range band for an RF input and an RF output of the wireless device. In addition, the antenna 216 may be a multiple input, multiple output (MIMO) antenna. Multiple input, multiple output antennas will be widely used for the RF front end of wireless devices to support features such as carrier aggregation.

Figure 2B:
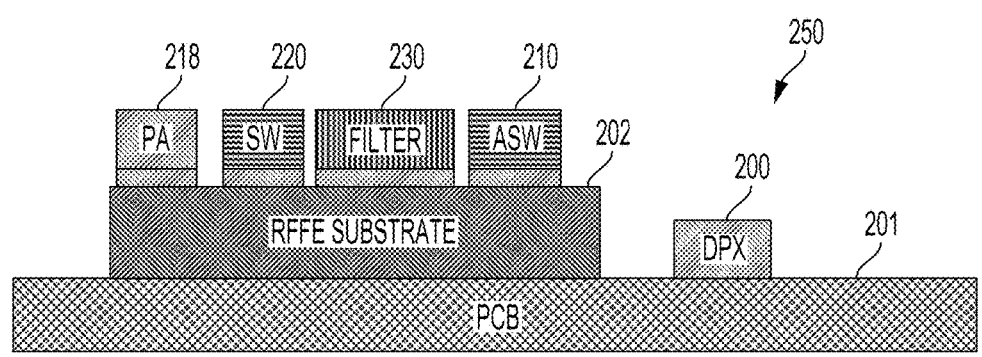
FIG. 2B is a diagram of a radio frequency (RF) front end module according to an aspect of the present disclosure.

FIG. 2B is a diagram of an RF front end module 250 according to an aspect of the present disclosure. The RF front end module 250 includes the antenna switch (ASW) 210 and diplexer 200 (or triplexer) to enable the wide range band noted in FIG. 2A. In addition, the RF front end module 250 includes filters 230, an RF switch 220 and power amplifiers 218 supported by a substrate 202. The filters 230 may include various LC filters, having inductors (L) and capacitors (C) arranged along the substrate 202 for forming a diplexer, a triplexer, low pass filters, balun filters, and/or notch filters to prevent high order harmonics in the RF front end module 250. The diplexer 200 may be implemented as a surface mount device (SMD) on a system board 201 (e.g., printed circuit board (PCB) or package substrate). Alternatively, the diplexer 200 may be implemented on the substrate 202.

In this configuration, the RF front end module 250 is implemented using silicon on insulator (SOI) technology, which helps reduce high order harmonics in the RF front end module 250. SOI technology replaces conventional silicon substrates with a layered silicon-insulator-silicon substrate to reduce parasitic device capacitance and improve performance. SOI-based devices differ from conventional silicon-built devices because the silicon junction is above an electrical insulator, typically a buried oxide (BOX) layer. A reduced thickness BOX layer, however, may not sufficiently reduce the parasitic capacitance caused by the proximity between an active device (on the silicon layer) and a substrate supporting the BOX layer. As a result, aspects of the present disclosure include a layer transfer process to further separate the active device from the substrate, as shown in FIGS. 3A to 3E.

Figure 3A:
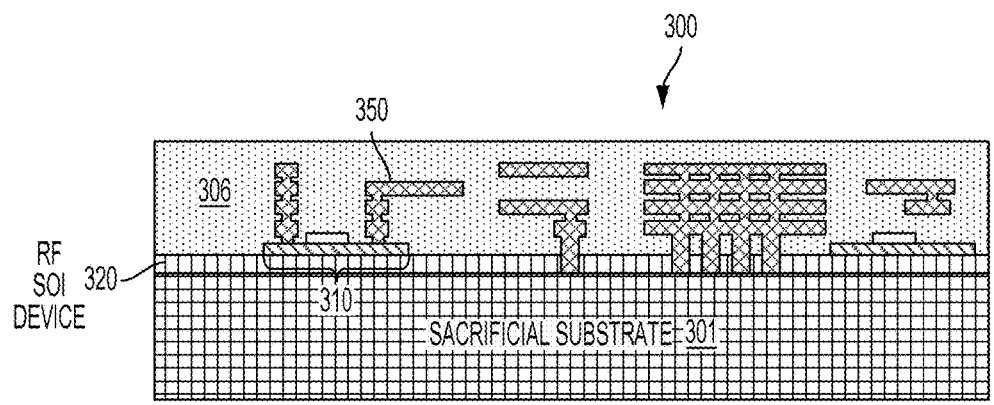
FIGS. 3A to 3E show cross-sectional views of an integrated radio frequency (RF) circuit structure during a layer transfer process according to aspects of the present disclosure.
Figure 3B:
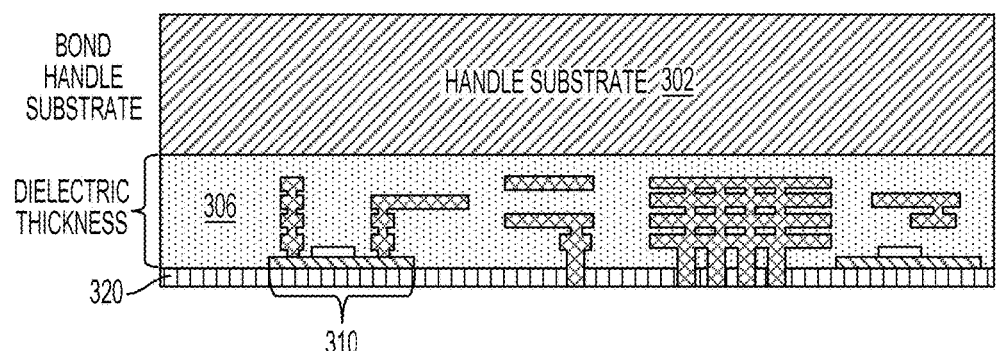

FIGS. 3A to 3E show cross-sectional views of an integrated radio frequency (RF) circuit structure 300 during a layer transfer process according to aspects of the present disclosure. As shown in FIG. 3A, an RF silicon on insulator (SOI) device includes an active device 310 on a buried oxide (BOX) layer 320 supported by a sacrificial substrate 301 (e.g., a bulk wafer). The RF SOI device also includes interconnects 350 coupled to the active device 310 within a first dielectric layer 306. As shown in FIG. 3B, a handle substrate 302 is bonded to the first dielectric layer 306 of the RF SOI device. In addition, the sacrificial substrate 301 is removed. Removal of the sacrificial substrate 301 using the layer transfer process enables high-performance, low-parasitic RF devices by increasing the dielectric thickness. That is, a parasitic capacitance of the RF SOI device is proportional to the dielectric thickness, which determines the distance between the active device 310 and the handle substrate 302.

Figure 3C:
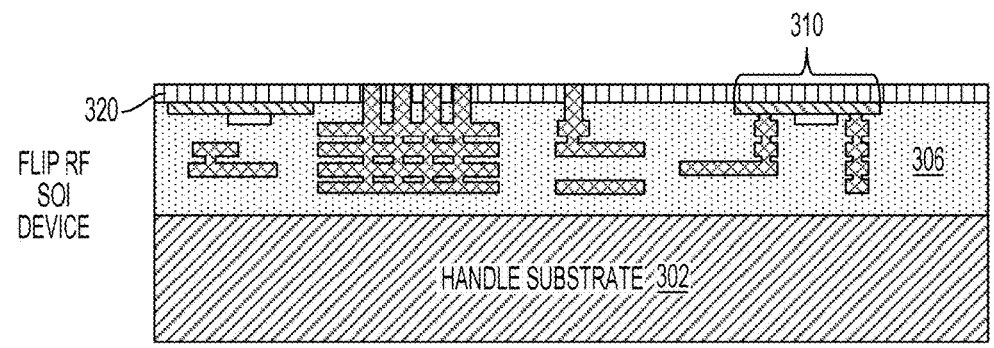
Figure 3D:
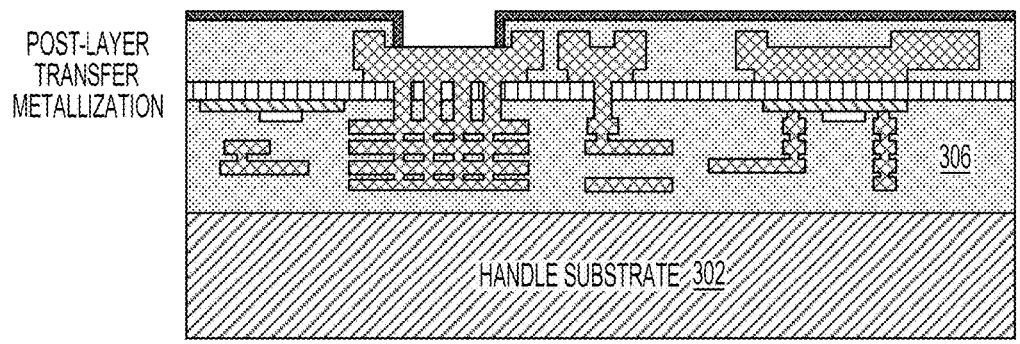
Figure 3E:
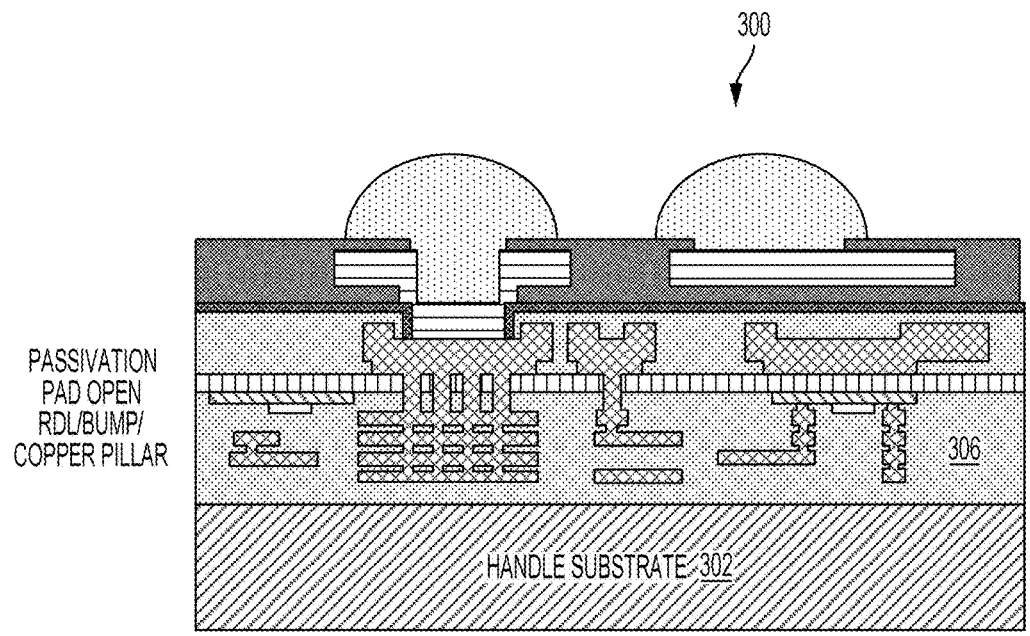

As shown in FIG. 3C, the RF SOI device is flipped once the handle substrate 302 is secured and the sacrificial substrate 301 is removed. As shown in FIG. 3D, a post layer transfer metallization process is performed using, for example, a regular complementary metal oxide semiconductor (CMOS) process. As shown in FIG. 3E, an integrated RF circuit structure 300 is completed by depositing a passivation layer, opening bond pads, depositing a redistribution layer, and forming conductive bumps/pillars to enable bonding of the integrated RF circuit structure 300 to a system board (e.g., a printed circuit board (PCB)).

Referring again to FIG. 3A, the RF SOI device may include a trap rich layer between the sacrificial substrate 301 and the BOX layer 320. In addition, the sacrificial substrate 301 may be replaced with the handle substrate, and a thickness of the BOX layer 320 may be increased to improve harmonics. Although this arrangement of the RF SOI device may provide improved harmonics relative to a pure silicon or SOI implementation, the RF SOI device is limited by the non-linear responses from the handle substrate, especially when a silicon handle substrate is used. That is, in FIG. 3A, the increased thickness of the BOX layer 320 does not provide sufficient distance between the active device 310 and the sacrificial substrate 301 relative to the configurations shown in FIGS. 3B to 3E. Moreover, a body of the active device 310 in the RF SOI device may not be tied.

Figure 4:
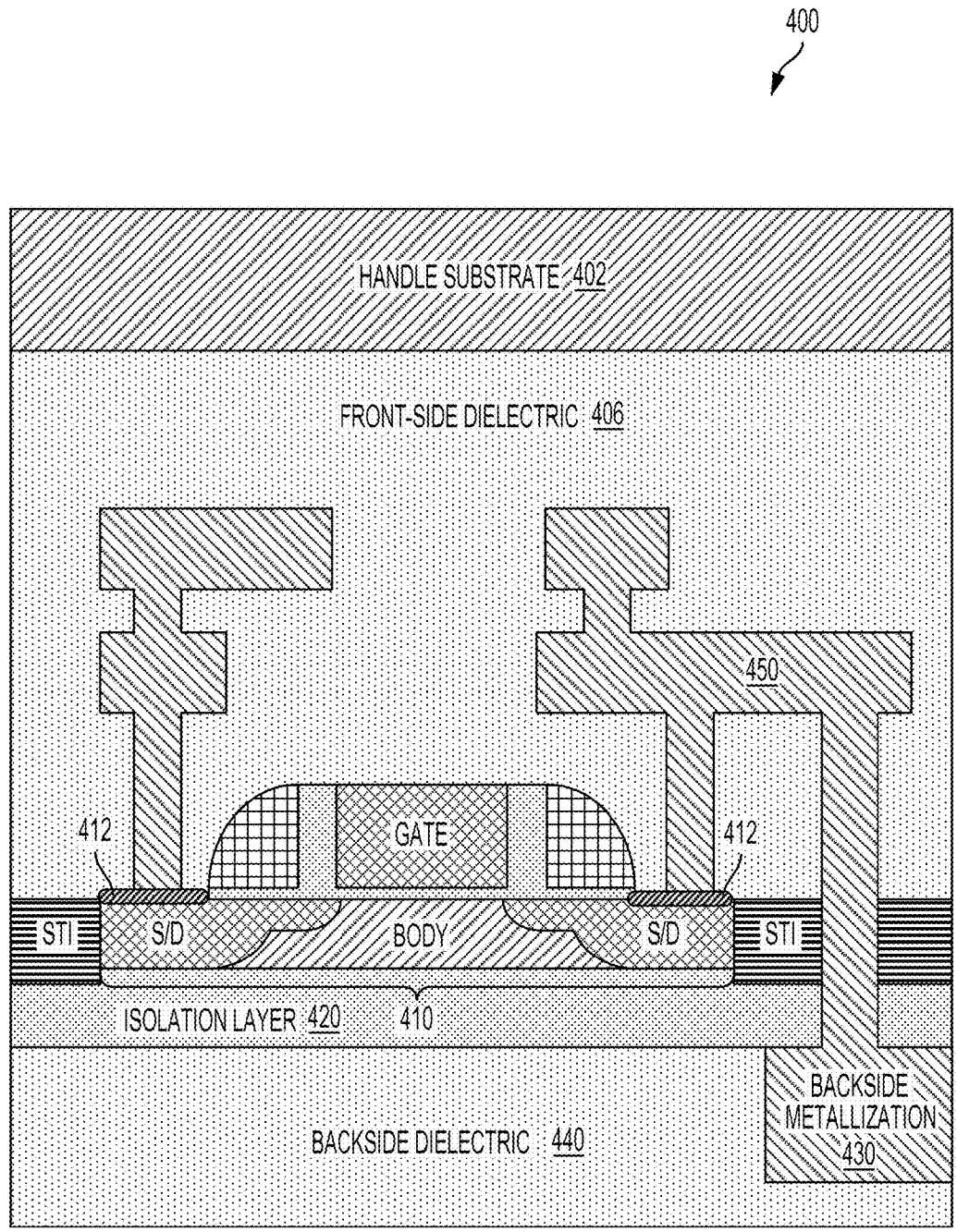
FIG. 4 is a cross-sectional view of an integrated radio frequency (RF) circuit structure fabricated using a layer transfer process according to aspects of the present disclosure.

FIG. 4 is a cross-sectional view of an integrated RF circuit structure 400 fabricated using a layer transfer process according to aspects of the present disclosure. Representatively, the integrated RF circuit structure 400 includes an active device 410 having a gate, a body, and source/drain regions formed on an isolation layer 420. In silicon on insulator (SOI) implementations, the isolation layer 420 is a buried oxide (BOX) layer, and the body and source/drain regions are formed from an SOI layer including shallow trench isolation (STI) regions supported by the BOX layer.

The integrated RF circuit structure 400 also includes middle-end-of-line (MEOL)/back-end-of-line (BEOL) interconnects coupled to the source/drain regions of the active device 410. As described herein, the MEOL/BEOL layers are referred to as front-side layers. By contrast, the layers supporting the isolation layer 420 may be referred to herein as backside layers. According to this nomenclature, a front-side interconnect 450 is coupled to the source/drain regions of the active device 410 through front-side contact 412, and arranged in a front-side dielectric layer 406. In addition, a handle substrate 402 is directly coupled to the front-side dielectric layer 406. In this configuration, a backside dielectric 440 is adjacent to and possibly supports the isolation layer 420. In addition, a backside metallization 430 is coupled to the front-side interconnect 450.

As shown in FIG. 4, a layer transfer process provides increased separation between the active device 410 and the handle substrate 402 to improve the harmonics of the integrated RF circuit structure 400. While the layer transfer process enables high-performance, low-parasitic RF devices, the integrated RF circuit structure 400 may suffer from the floating body effect. Accordingly, the performance of the integrated RF circuit structure 400 may be further improved by using a post transfer metallization to provide access to a backside of the active device 410 to tie the body region of the active device 410.

Various aspects of the disclosure provide techniques for a post layer transfer deposition/growth process on a backside of active devices of an integrated radio frequency (RF) integrated structure. By contrast, access to active devices, formed during a front-end-of-line (FEOL) process, is conventionally provided during middle-end-of-line (MEOL) processing that provides contacts between the gates and source/drain regions of the active devices and back-end-of-line (BEOL) interconnect layers (e.g., M1, M2, etc.). Aspects of the present disclosure involve a post layer transfer growth/deposition process for forming backside extended (raised) source/drain/body regions of transistors that may be used as antenna switch transistors in integrated radio frequency (RF) circuit structures for high quality (Q)-factor RF applications. Other applications include an active device in a low power amplifier module, a low noise amplifier, and an antenna diversity switch.

Figure 5A:
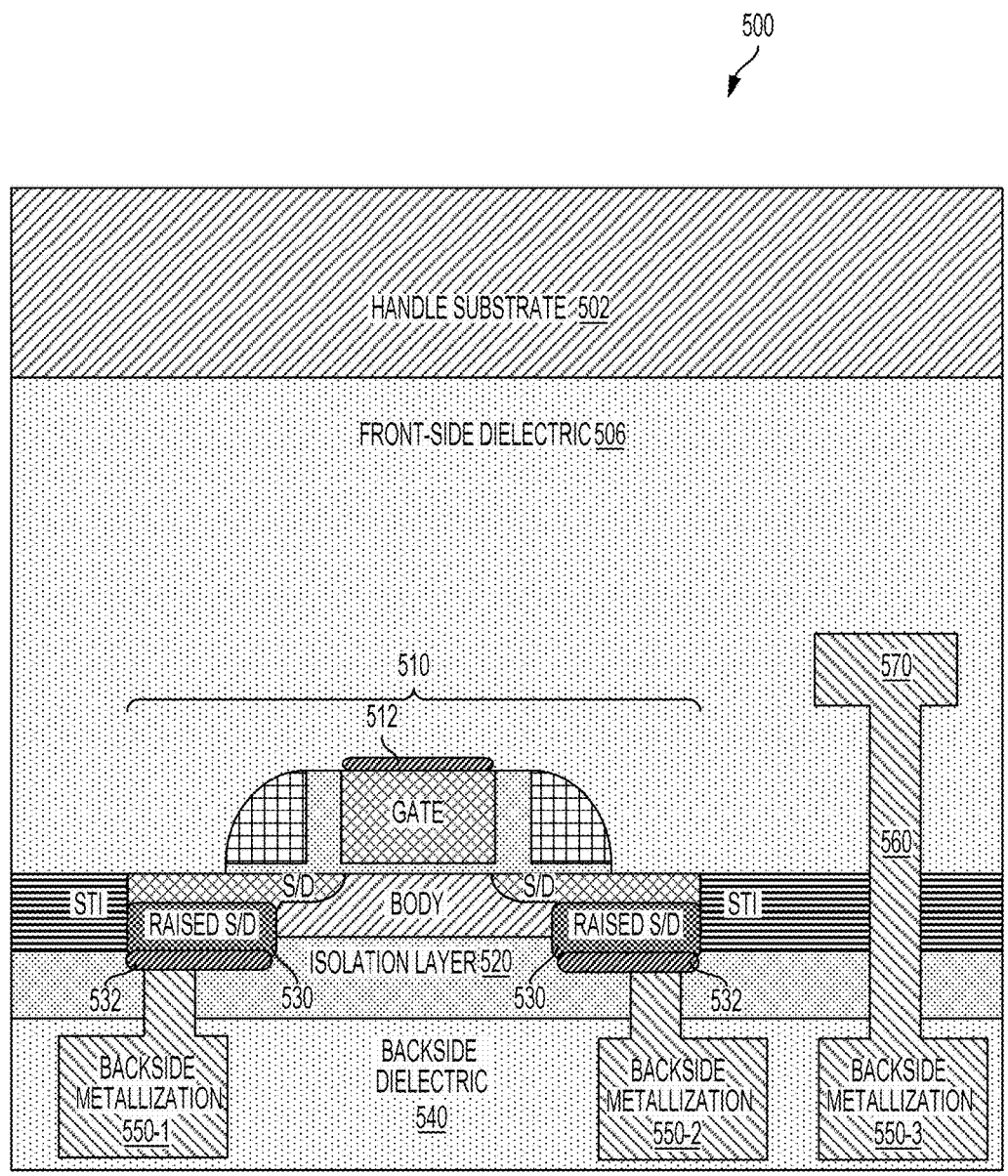
FIGS. 5A and 5B illustrate integrated circuit structures, in which a post-layer transfer process forms backside raised source/drain regions of an active device according to aspects of the present disclosure.

FIG. 5A is a cross-sectional view of an integrated circuit structure 500, in which a post-layer transfer process is performed on a backside of source/drain (S/D) regions of an active device (e.g., a transistor) according to aspects of the present disclosure. Representatively, the integrated circuit structure 500 includes an active device 510 having a gate, a body, and source/drain (S/D) regions formed on an isolation layer 520. The isolation layer 520 may be a buried oxide (BOX) layer for silicon on insulator (SOI) implementation, in which the body and source/drain regions are formed from an SOI layer. In this configuration, shallow trench isolation (STI) regions are also supported by the BOX layer.

The integrated RF circuit structure 500 includes a front-side metallization 570 (e.g., a first BEOL interconnect (M1)) arranged in a front-side dielectric layer 506. The front-side metallization is coupled to a third portion 550-3 of a backside metallization 550 through a via 560, in which the backside metallization 550 is arranged in a backside dielectric layer 540. In addition, the gate of the active device 510 includes a gate contact 512, which may be composed of a front-side silicide layer. In addition, a handle substrate 502 is coupled to the front-side dielectric layer 506. The backside dielectric layer 540 is adjacent to and possibly supports the isolation layer 520. In this configuration, a post layer transfer metallization process forms the backside metallization 550.

In aspects of the present disclosure, a post layer transfer process is used to provide a backside semiconductor layer on a backside of the source/drain regions of the active device 510. In aspects of the present disclosure, the backside semiconductor layer may be deposited as an amorphous semiconductor layer. Alternatively, the backside semiconductor layer may be epitaxially grown as part of a post layer transfer growth process. Once formed, the backside semiconductor layer may be optionally subjected to a post deposition anneal process (e.g., a low temperature or a short local, laser anneal) to form raised source/drain (S/D) regions 530. In this configuration, the backside raised source/drain regions 530 extend from a backside of the source/drain regions of the active device 510 into the isolation layer 520. Once formed, a backside contact 532 (e.g., a backside silicide layer) may be deposited on the backside raised source/drain regions 530 distal from a front-side of the source/drain regions. A post-layer transfer metallization process is then performed to couple a first portion 550-1 and a second portion 550-2 of the backside metallization 550 to the backside contacts 532 of the backside raised source/drain regions 530 of the active device 510. As shown in FIG. 5A, the front-side metallization 570 is arranged distal from the backside metallization 550.

Figure 5B:
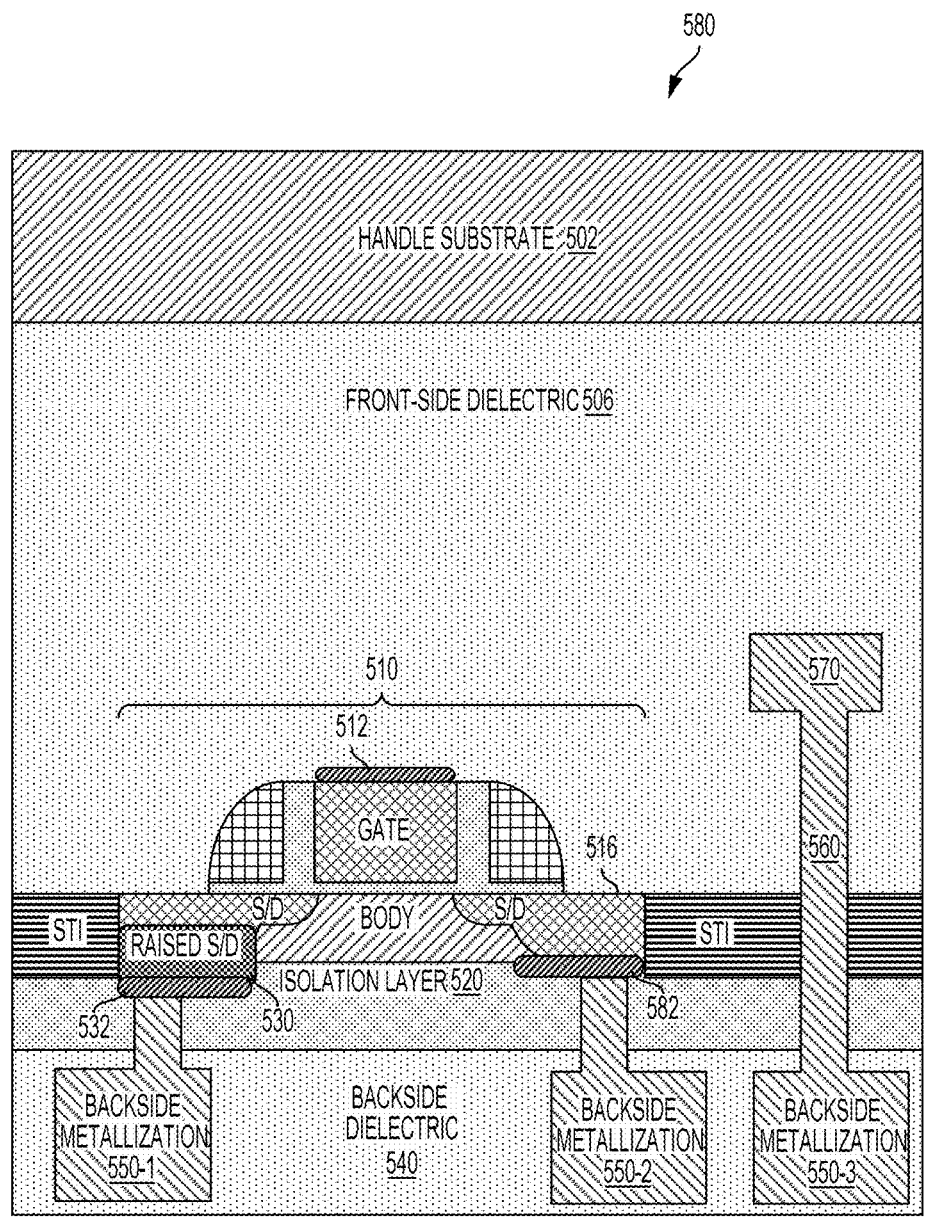

FIG. 5B is a cross-sectional view of an integrated circuit structure 580, in which a post-layer transfer process is also performed on a backside of a source/drain (S/D) region 516 of an active device 510 (e.g., a transistor) according to aspects of the present disclosure. As will be recognized, a configuration of the integrated circuit structure 580 is similar to the configuration of the integrated circuit structure 500 of FIG. 5A. In the configuration shown in FIG. 5B, however, the active device 510 includes only one of the backside raised source/drain regions 530. Instead, a backside contact 582 is directly on a backside of the source/drain region 516 of the active device 510. In addition, the second portion 550-2 of the backside metallization 550 is coupled to the backside contact 582 of the source/drain region 516 of the active device 510.

Referring again to FIG. 5A, the backside raised source/drain regions 530 are provided in the isolation layer 520 and arranged to enable contact with the backside metallization 550. The extension of the source/drain regions of the active device 510 helps prevent the formation of parasitic capacitance between the body of the active device 510 and conventional front-side raised source/drain regions. In this configuration, the post-layer transfer process may include a post-layer deposition process or a post-layer growth process for forming the backside raised source/drain regions 530. In this configuration, the backside raised source/drain regions 530 may reduce the parasitic capacitance associated with raised source/drain regions fabricated using conventional CMOS processes.

According to aspects of the present disclosure, the handle substrate 502 may be composed of a semiconductor material, such as silicon. In this configuration, the handle substrate 502 may include at least one other active device. Alternatively, the handle substrate 502 may be a passive substrate to further improve harmonics by reducing parasitic capacitance. In this configuration, the handle substrate 502 may include at least one other passive device. As described herein, the term "passive substrate" may refer to a substrate of a diced wafer or panel, or may refer to the substrate of a wafer/panel that is not diced. In one configuration, the passive substrate is comprised of glass, air, quartz, sapphire, high-resistivity silicon, or other like passive material. The passive substrate may also be a coreless substrate.

Figure 6A:
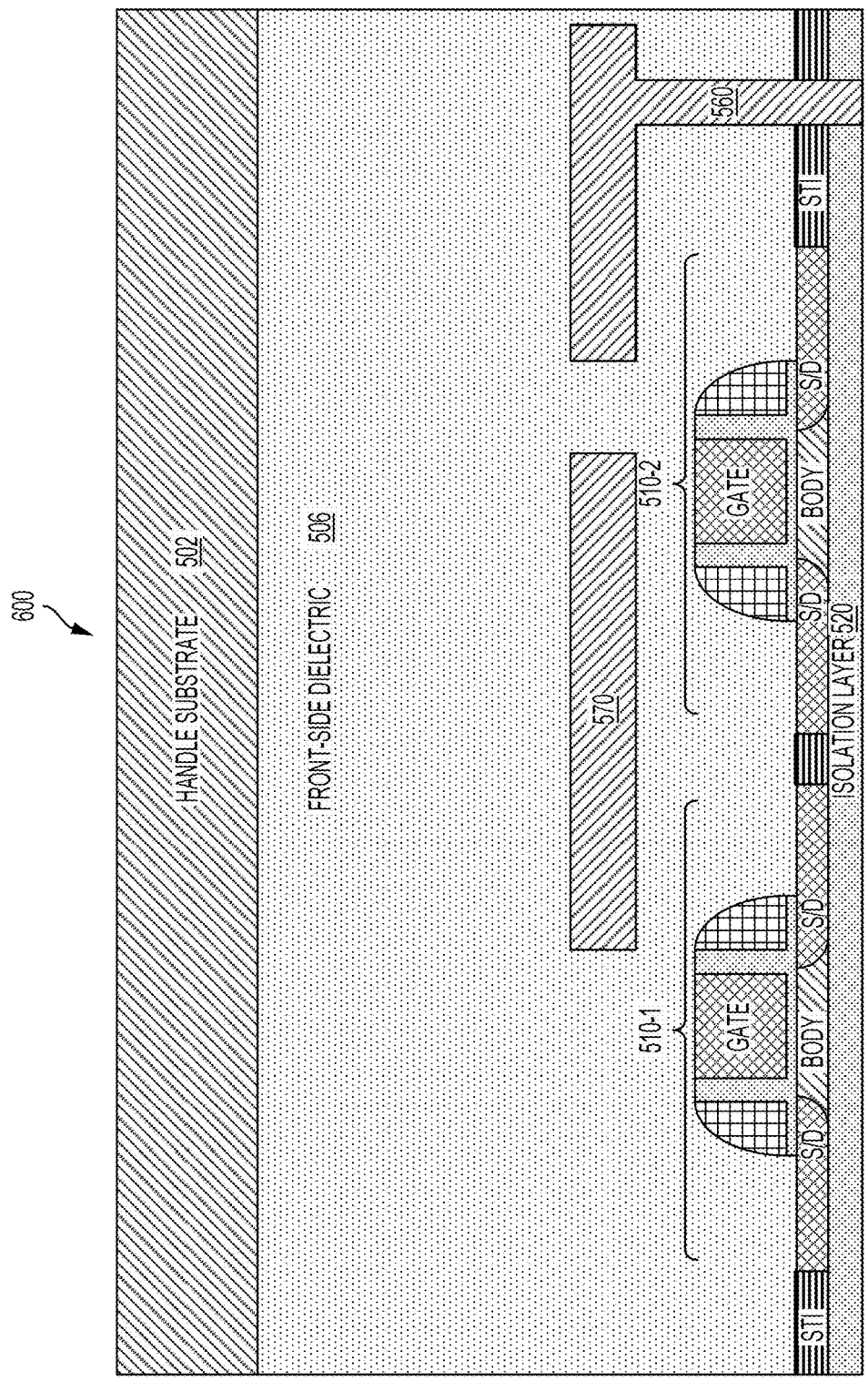
FIGS. 6A to 6E are cross-sectional views illustrating a process for fabricating an integrated circuit structure, including backside raised source/drain regions according to aspects of the present disclosure.
Figure 6B:
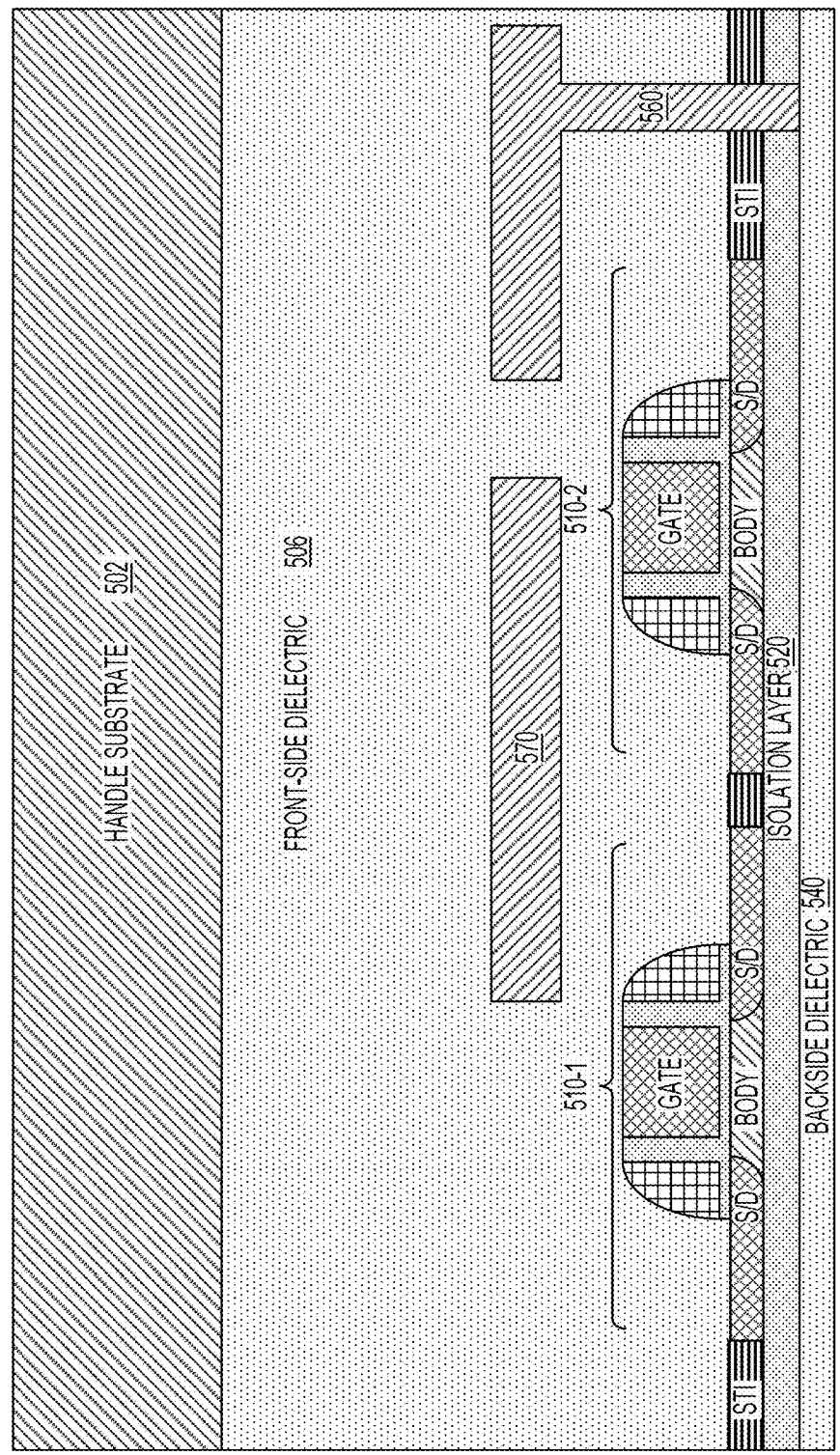

FIGS. 6A to 6E are cross-sectional views illustrating a process for fabrication of an integrated circuit structure, including backside extended source/drain regions, according to aspects of the present disclosure. As shown in FIG. 6A, an integrated circuit structure 600 is shown in a configuration similar to the configuration of the integrated circuit structure 500 shown in FIG. 5A. In the configuration shown in FIG. 6A, however, a layer transfer process is performed to bond the handle substrate 502 to the front-side dielectric layer 506 following formation of the active devices 510 (510-1, and 510-2). As shown in FIG. 6B, a post-layer transfer process begins with the deposition of a backside dielectric layer 540. Although a single layer is shown, it should be recognized that multiple dielectric layers may be deposited.

Figure 6C:
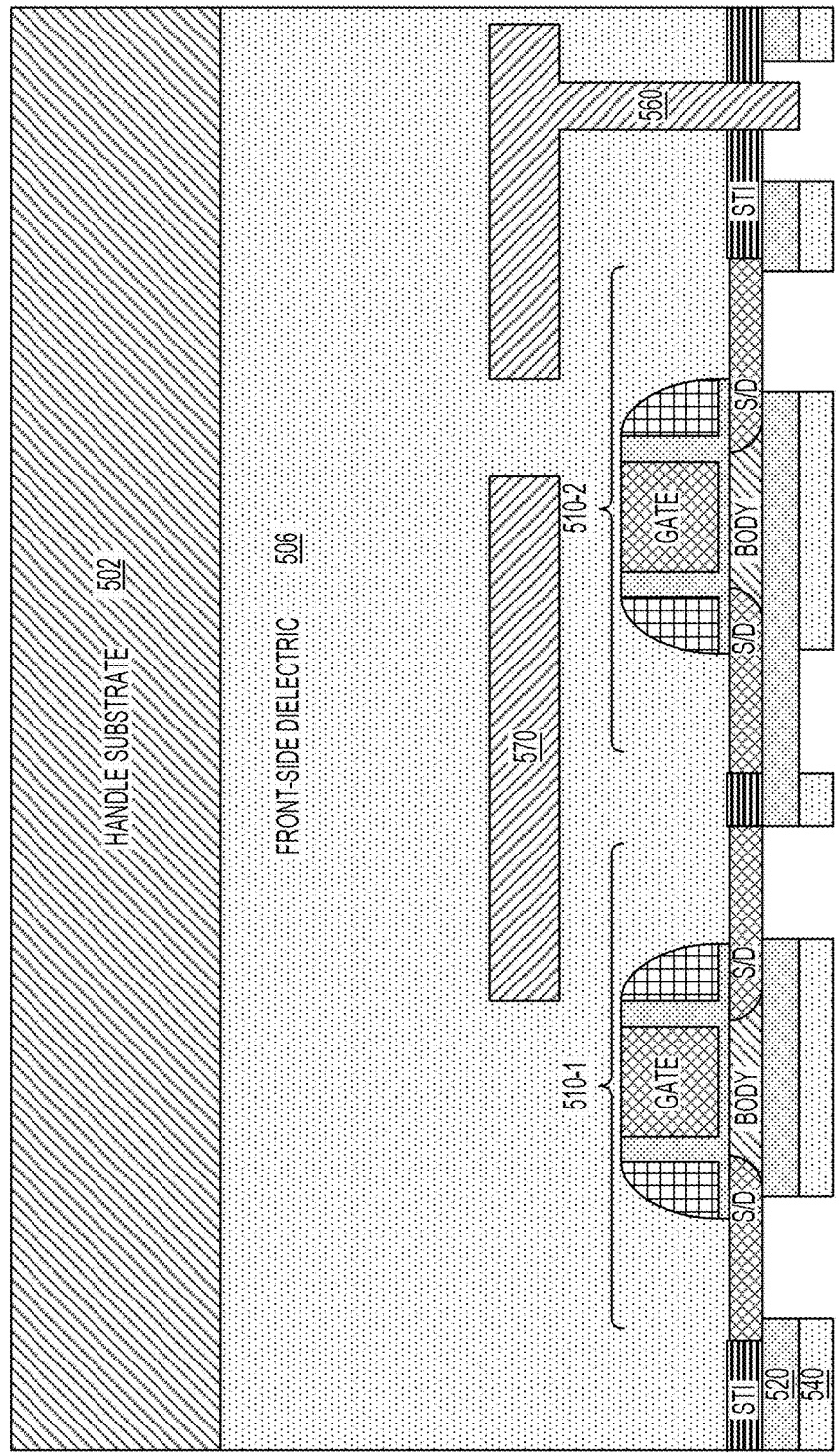
Figure 6D:
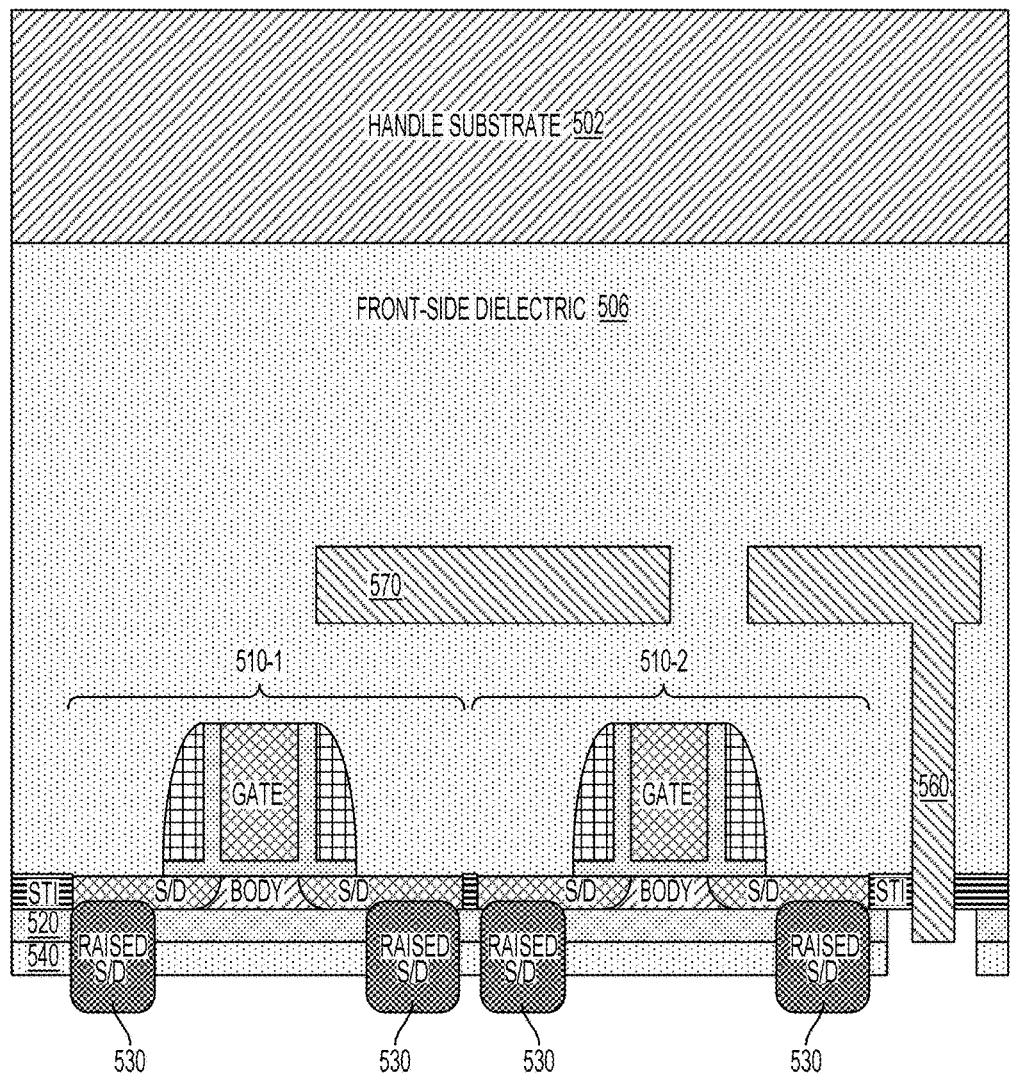
Figure 6E:
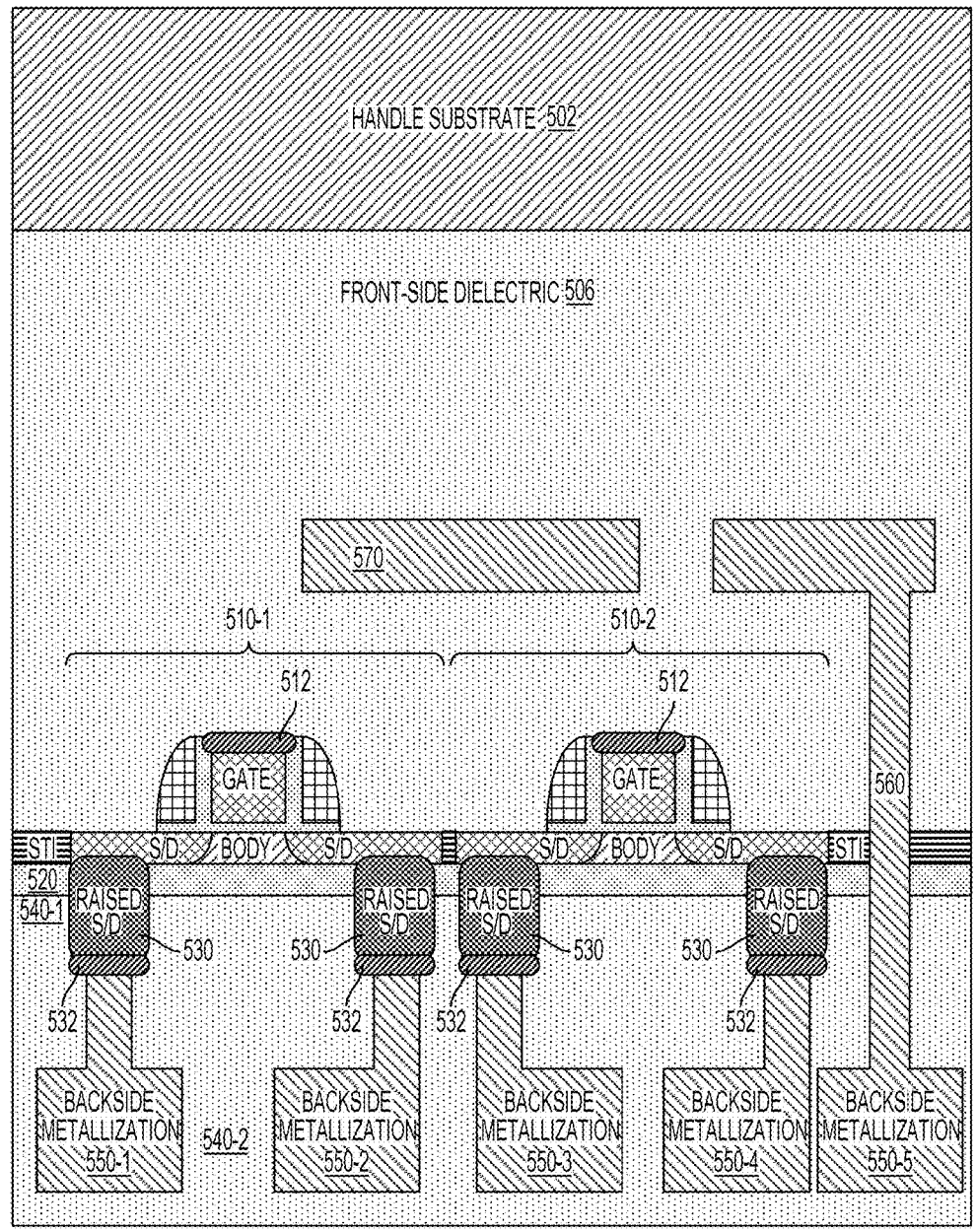

As shown in FIG. 6C, the post-layer transfer process continues with patterning and etching of the backside dielectric layer 540 and the isolation layer 520 to expose a backside of the source/drain regions of the active devices 510. In FIG. 6D, a post-layer transfer deposition/growth process is performed to fabricate the backside raised source/ drain regions 530. In FIG. 6E, a post-layer transfer metallization process is performed to couple the backside metallization 550 to the backside raised source/drain regions 530 through the backside contacts 532. In addition, a fifth portion 550-5 of the backside metallization 550 is coupled to the front-side metallization 570 through the via 560. In this configuration, a third portion 550-3 of the backside metallization 550 is coupled to the backside contact 532 of one of the backside raised source/drain regions 530, and a fourth portion 550-4 of the backside metallization 550 is coupled to the backside contact 532 of one of the backside raised source/drain regions 530 of a second active device 510-2.

Different materials can be used in the growth process to stress the active devices. For example, PFET devices can be stressed with Germanium growth, up to 40% in one configuration. NMOS devices can be stressed using, for example, carbon-doped silicon, with the percentage of carbon being no more than 3% to four percent. This percentage of carbon prevents dislocations in the silicon. It should be recognized that a raised body region can also include stressors.

Figure 7A:
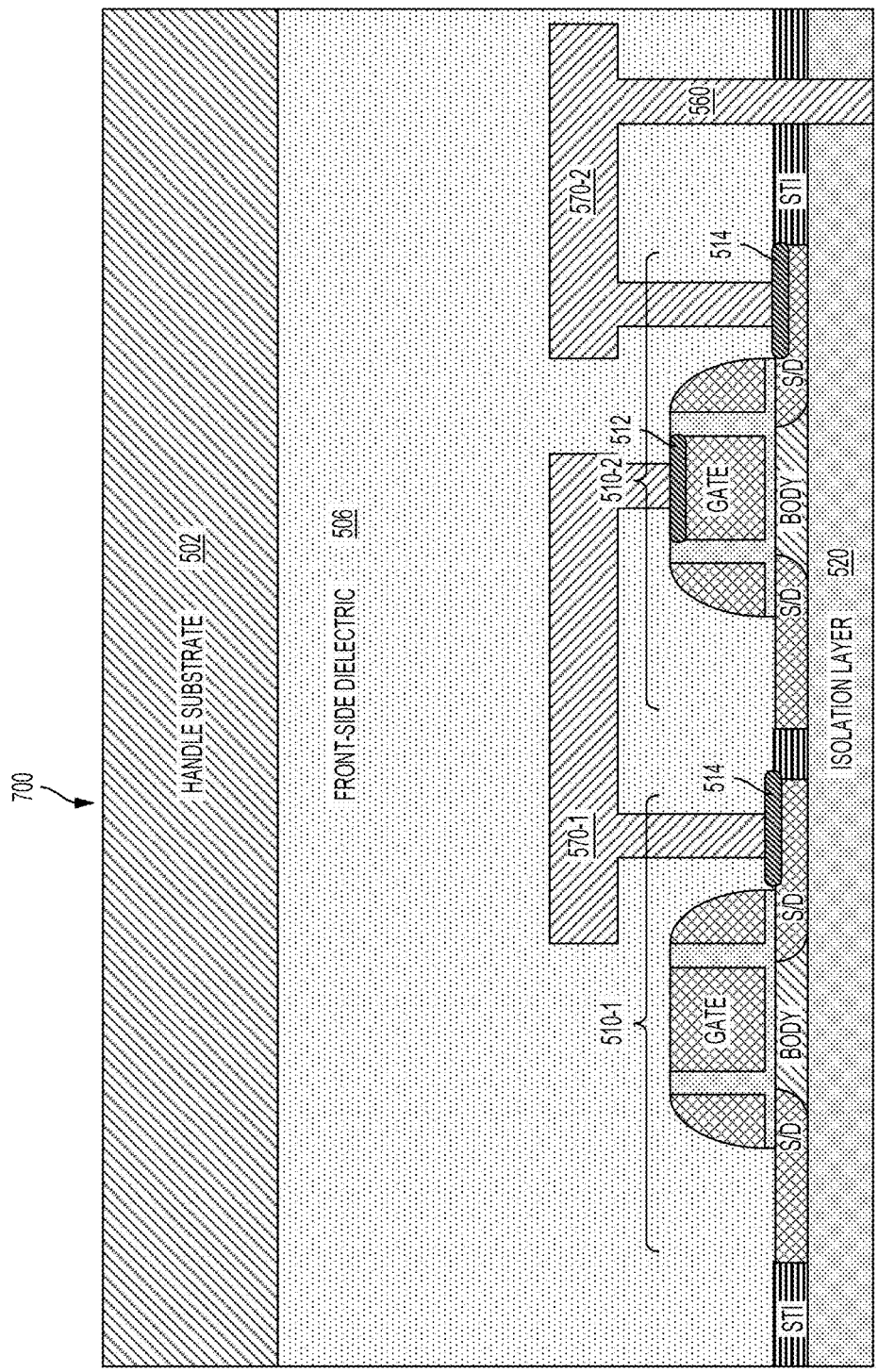
FIGS. 7A to 7E are cross-sectional views illustrating a process for fabricating an integrated circuit structure, including backside extended source/drain/body regions according to aspects of the present disclosure.

FIGS. 7A to 7E are cross-sectional views illustrating a process for fabrication of an integrated circuit structure, including backside extended source/drain/body regions according to aspects of the present disclosure. As shown in FIG. 7A, an integrated circuit structure 700 is shown in a configuration similar to the configuration of the integrated circuit structure 500 shown in FIG. 5A. In the configuration shown in FIG. 7A, however, a layer transfer process is performed to bond the handle substrate 502 to the front-side dielectric layer 506 following formation of the active devices 510 (510-1, and 510-2). In addition, a first portion 570-1 of the front-side metallization 570 couples a front-side contact 514 of a source/drain region of a first active device 510-1 to a gate contact 512 of a second active device 510-2. Also, a second portion 570-2 of the front-side metallization 570 couples a front-side contact 514 of the source/drain region of the second active device 510-2 to the via 560.

Figure 7B:
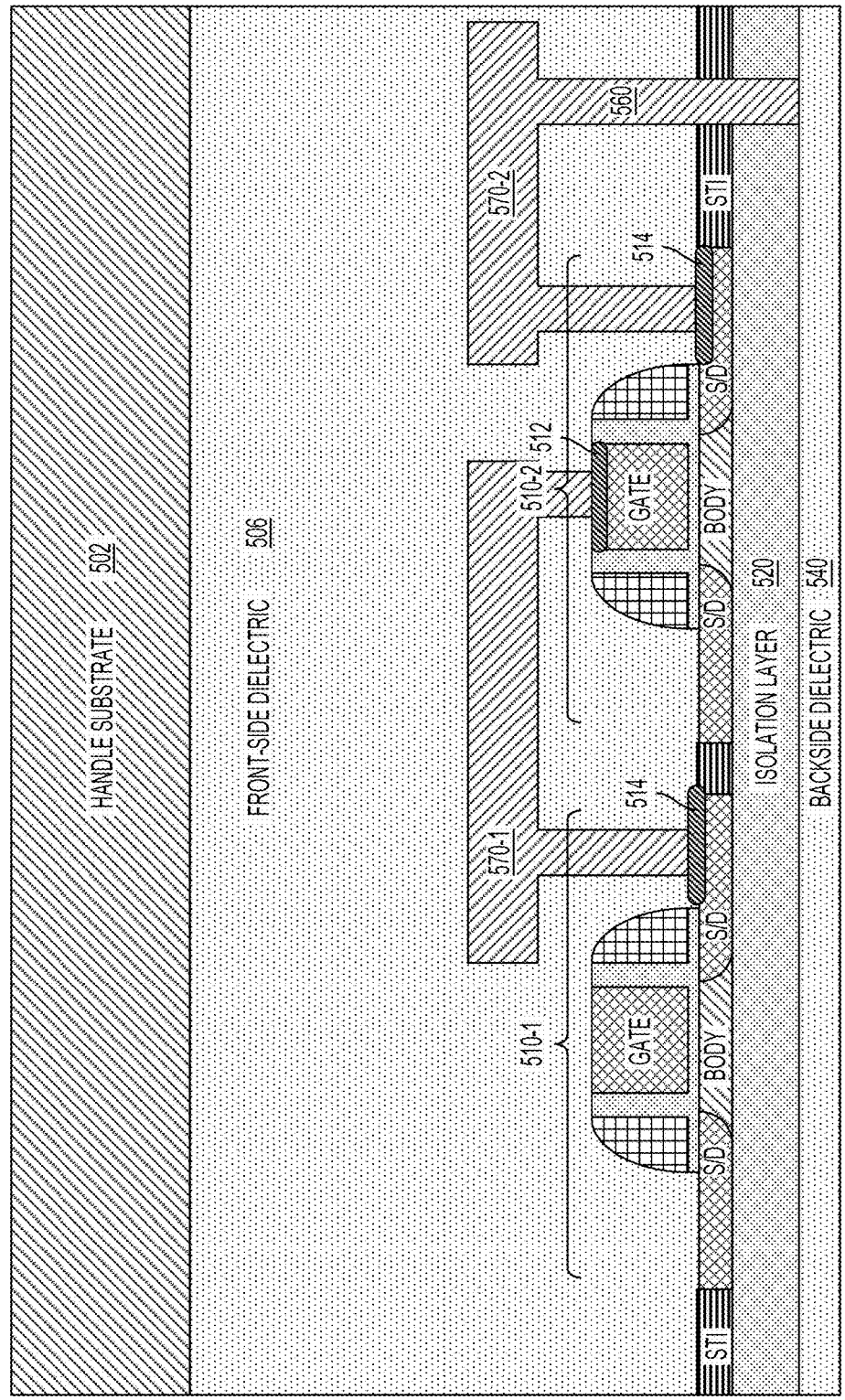
Figure 7C:
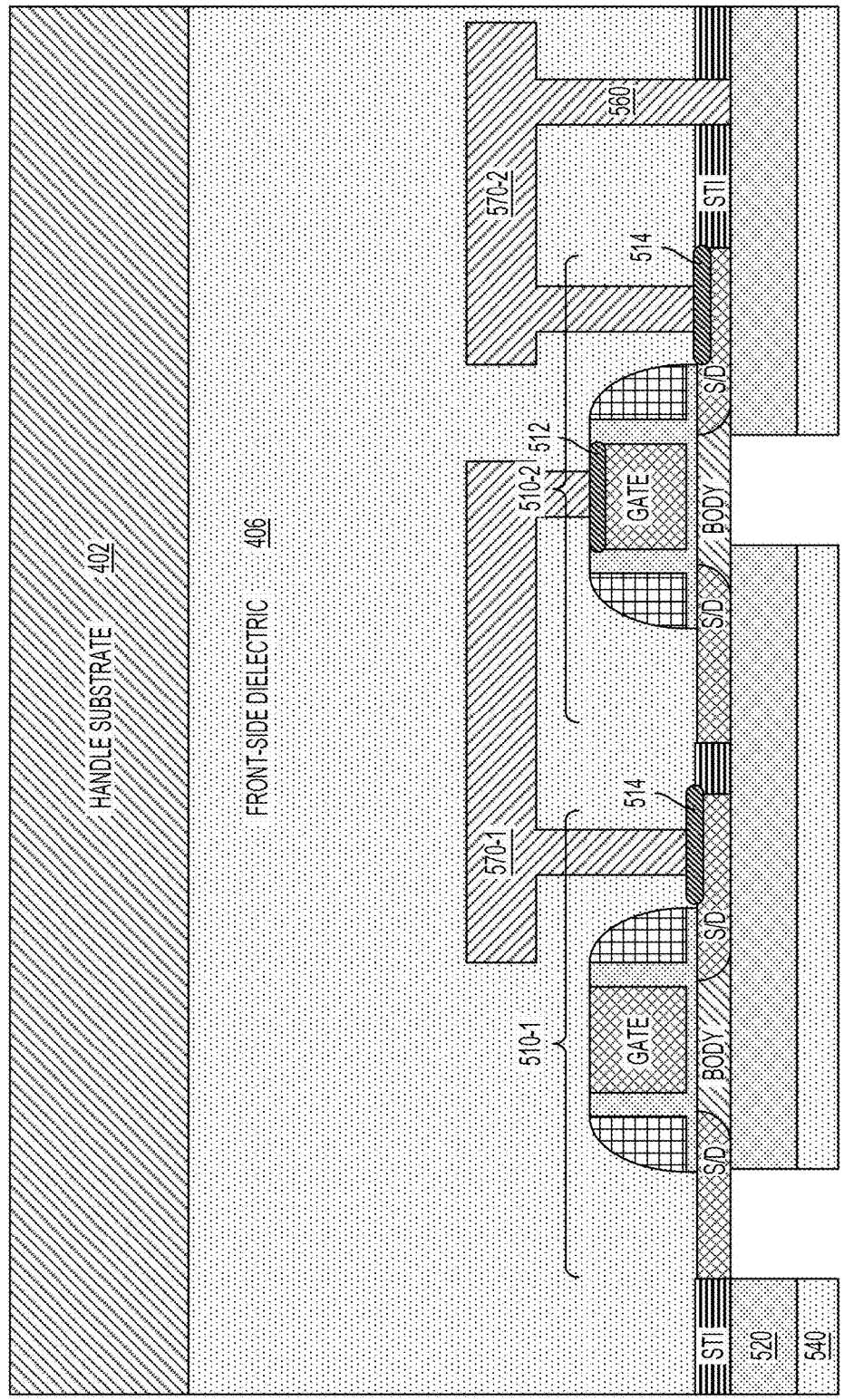
Figure 7D:
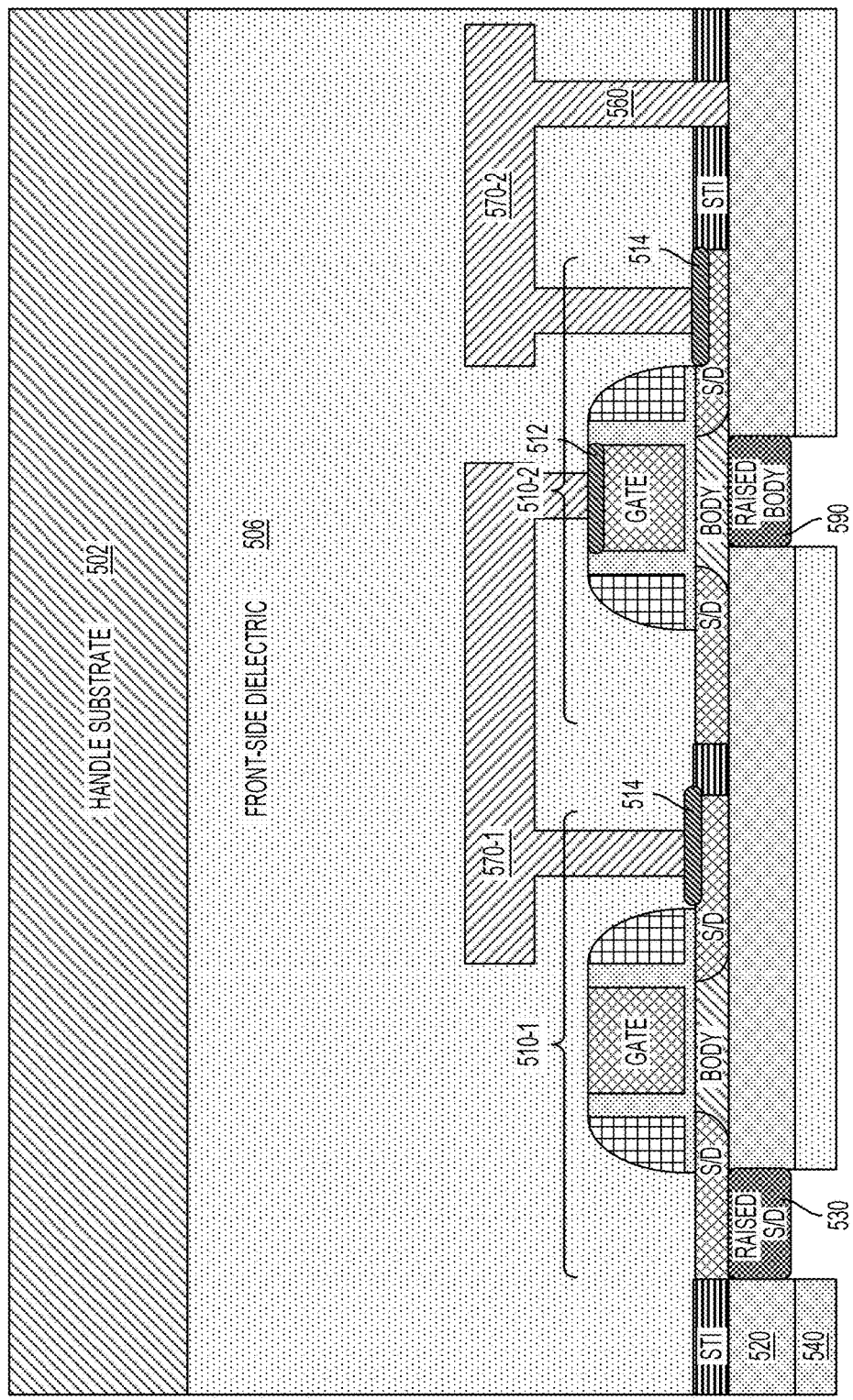

As shown in FIG. 7B, the post-layer transfer process also begins with the deposition of the backside dielectric layer 540. As shown in FIG. 7C, the post-layer transfer process also continues with patterning and etching of the backside dielectric layer 540 and the isolation layer 520 to expose a backside of the source/drain region of the first active device 510-1. In this aspect of the present disclosure, the post layer transfer process exposes a body of the second active device 510-2. In FIG. 7D, a post-layer transfer deposition/growth process is performed to fabricate a backside raised source/drain region 530 and a backside raised body region 590.

Figure 7E:
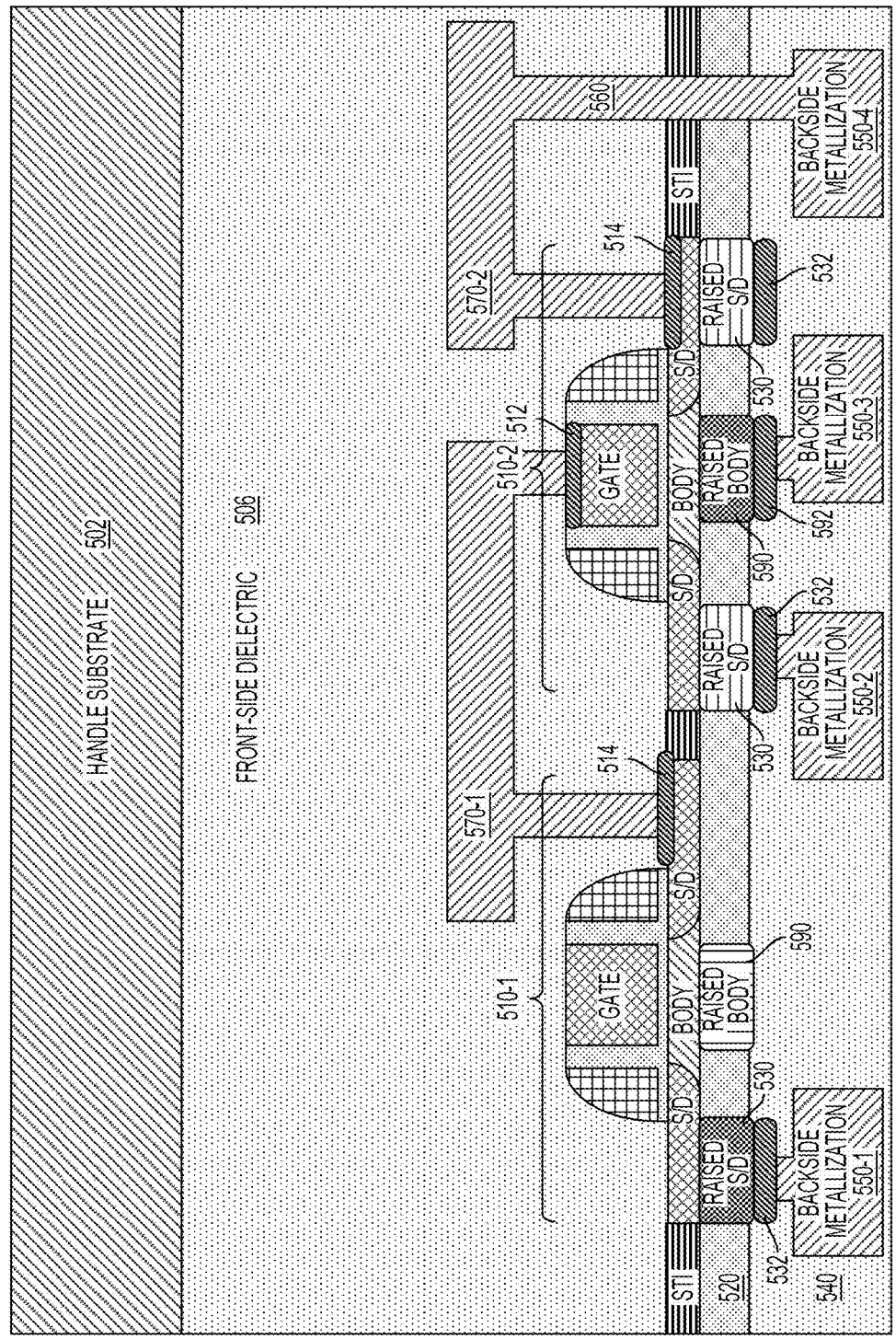

In FIG. 7E, a post-layer transfer metallization process is performed to couple the backside metallization 550 to the backside raised source/drain regions 530 through the backside contacts 532. In addition, a fourth portion 550-4 of the backside metallization 550 is coupled to the second portion of front-side metallization 570 through the via 560. In this configuration, a third portion 550-3 of the backside metallization 550 is coupled to a backside contact 592 of the backside raised body region 590. In this aspect of the present disclosure, the backside raised body region 590 is doped with a different dopant than the dopant of the backside raised source/drain regions 530. In addition, the backside raised body region 590 of the first active device 510-1 is doped with a different dopant than the dopant of the backside raised body region 590 of the second active device 510-2.

Figure 8A:
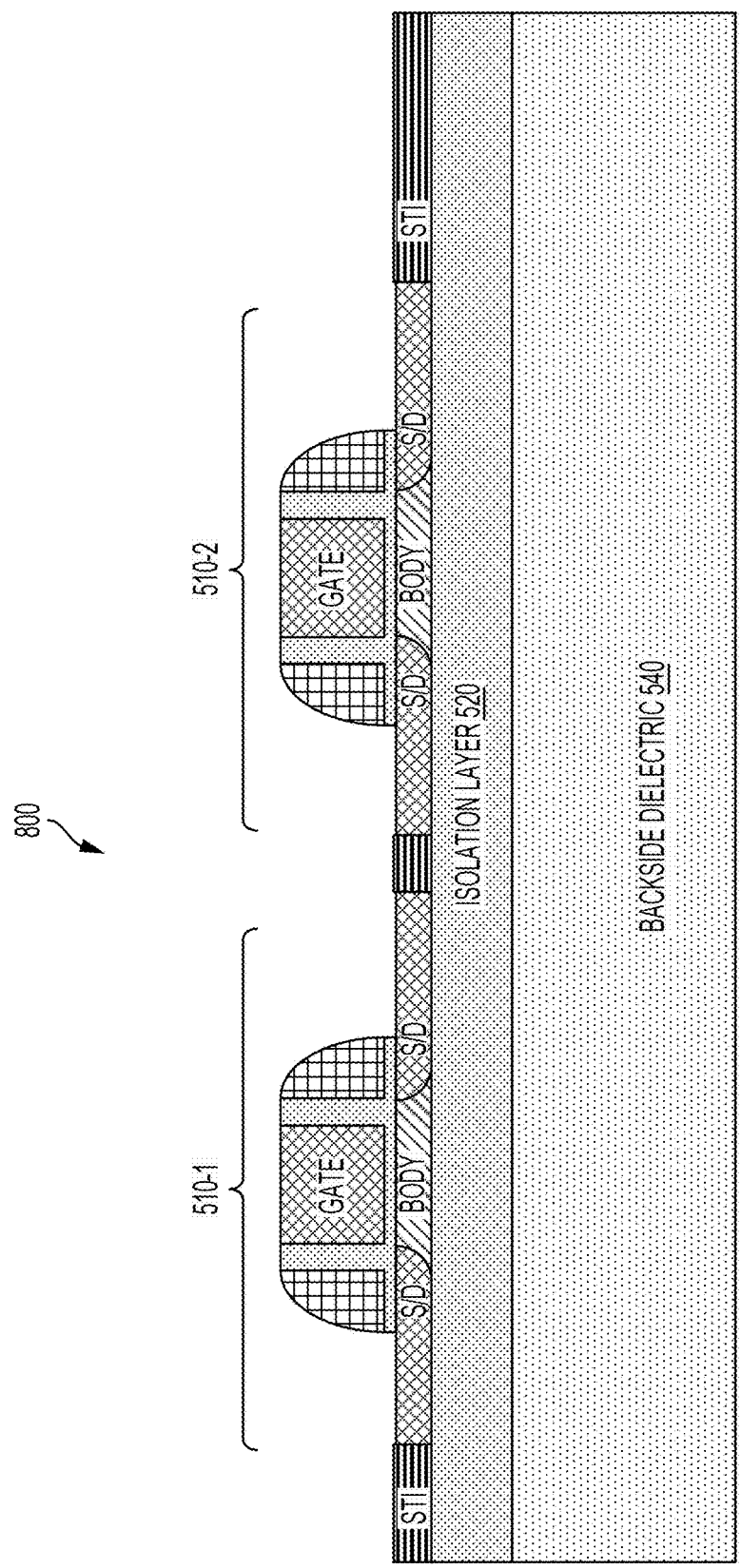
FIGS. 8A to 8E are cross-sectional views illustrating a process for self-alignment between the source/drain/body regions of an active device and the backside extended source/drain/body regions of the active device according to aspects of the present disclosure.

FIGS. 8A to 8E are cross-sectional views illustrating a process for self-alignment between the source/drain/body regions of an active device and the backside extended source/drain/body regions of the active device according to aspects of the present disclosure. As shown in FIG. 8A, an integrated circuit structure 800 is shown in a configuration similar to the configuration of the integrated circuit structure 700 shown in FIG. 7A. In the configuration shown in FIG. 8A, however, the layer transfer process to bond the handle substrate 502 to the front-side dielectric layer 506 following formation of the active devices 510 (510-1, and 510-2) is not shown. In addition, the configuration of the integrated circuit structure shown in FIG. 8D also includes the first portion 570-1 of the front-side metallization 570 coupling the front-side contact 514 of the source/drain region of the first active device 510-1 to the gate contact 512 of the second active device 510-2. Also, the second portion 570-2 of the front-side metallization 570 couples the front-side contact 514 of the source/drain region of the second active device 510-2 to the via 560.

Figure 8B:
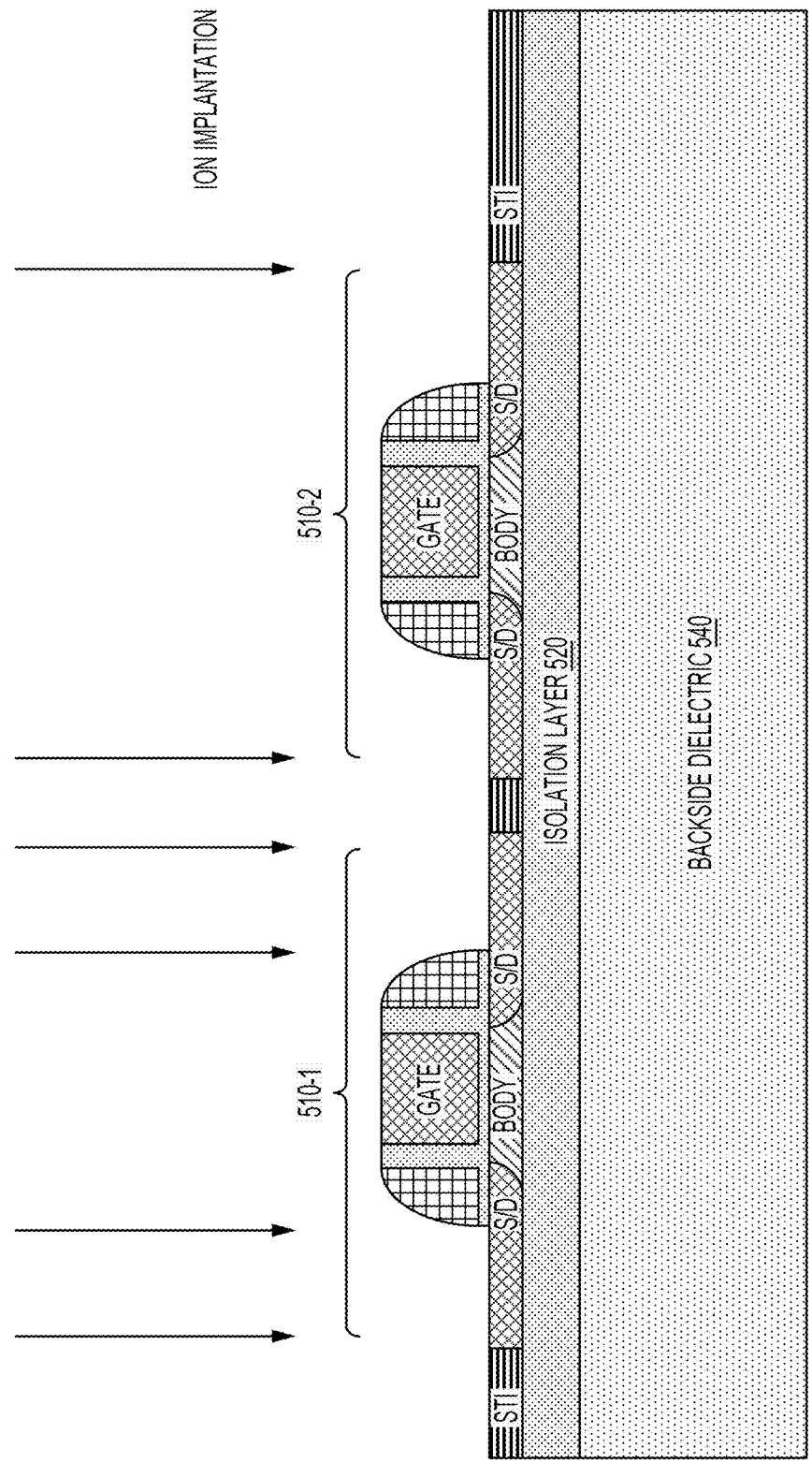
Figure 8C:
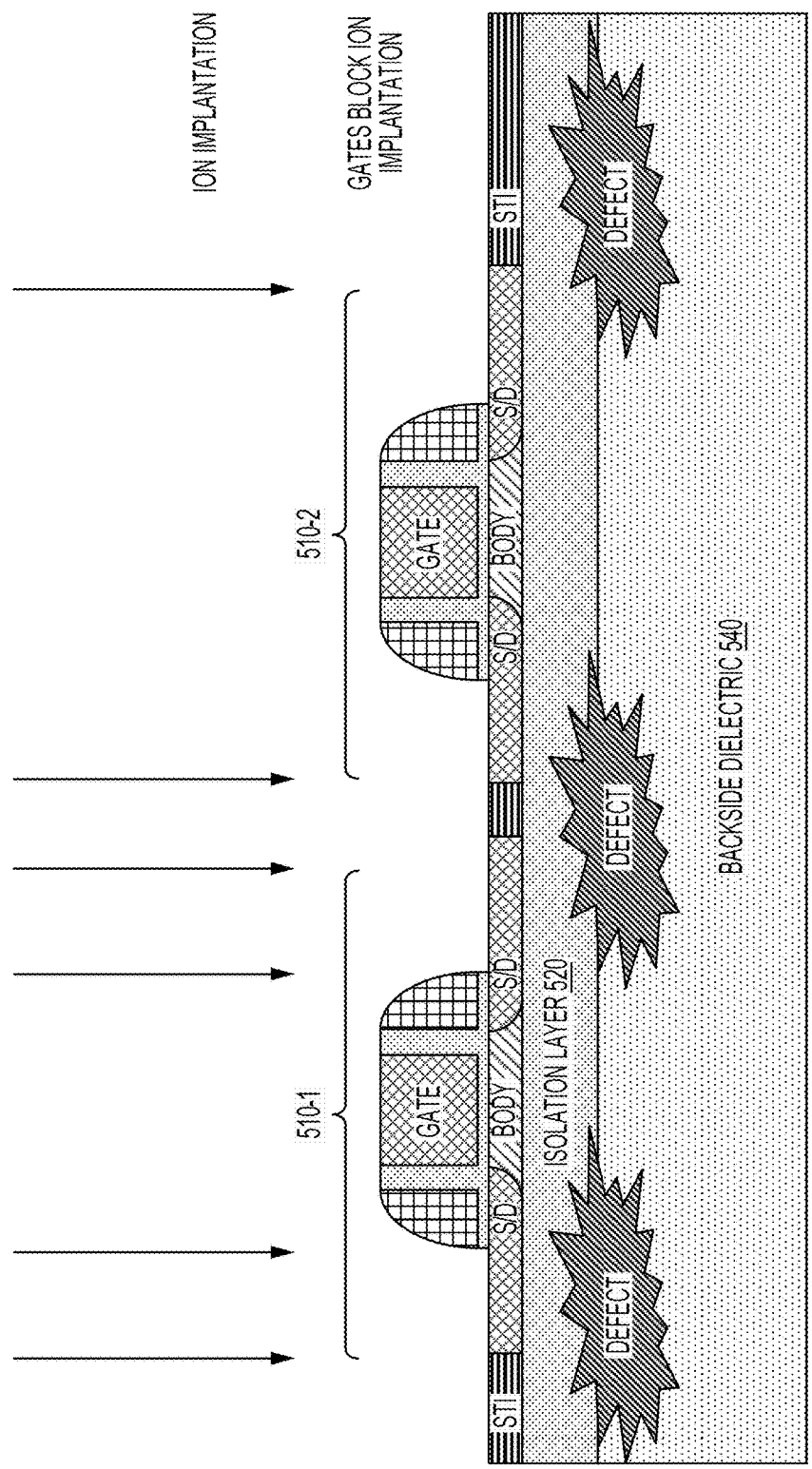

As shown in FIG. 8B, an ion implant process is performed to implant impurities into the backside dielectric layer 540 by implanting ions in the backside dielectric layer 540 and the isolation layer 520. The implanting is performed from a front-side of the integrated circuit structure 800. Specific dopants, e.g., high dose Boron, can be used to damage (create defects in) the buried oxide layer. As shown in FIG. 8C, the ion implant process is blocked by the gates of the active devices 510. As a result, the implanted defects are generally confined to areas within the backside dielectric layer 540 and the isolation layer that are proximate to the source/drain regions of the active devices 510.

Figure 8D:
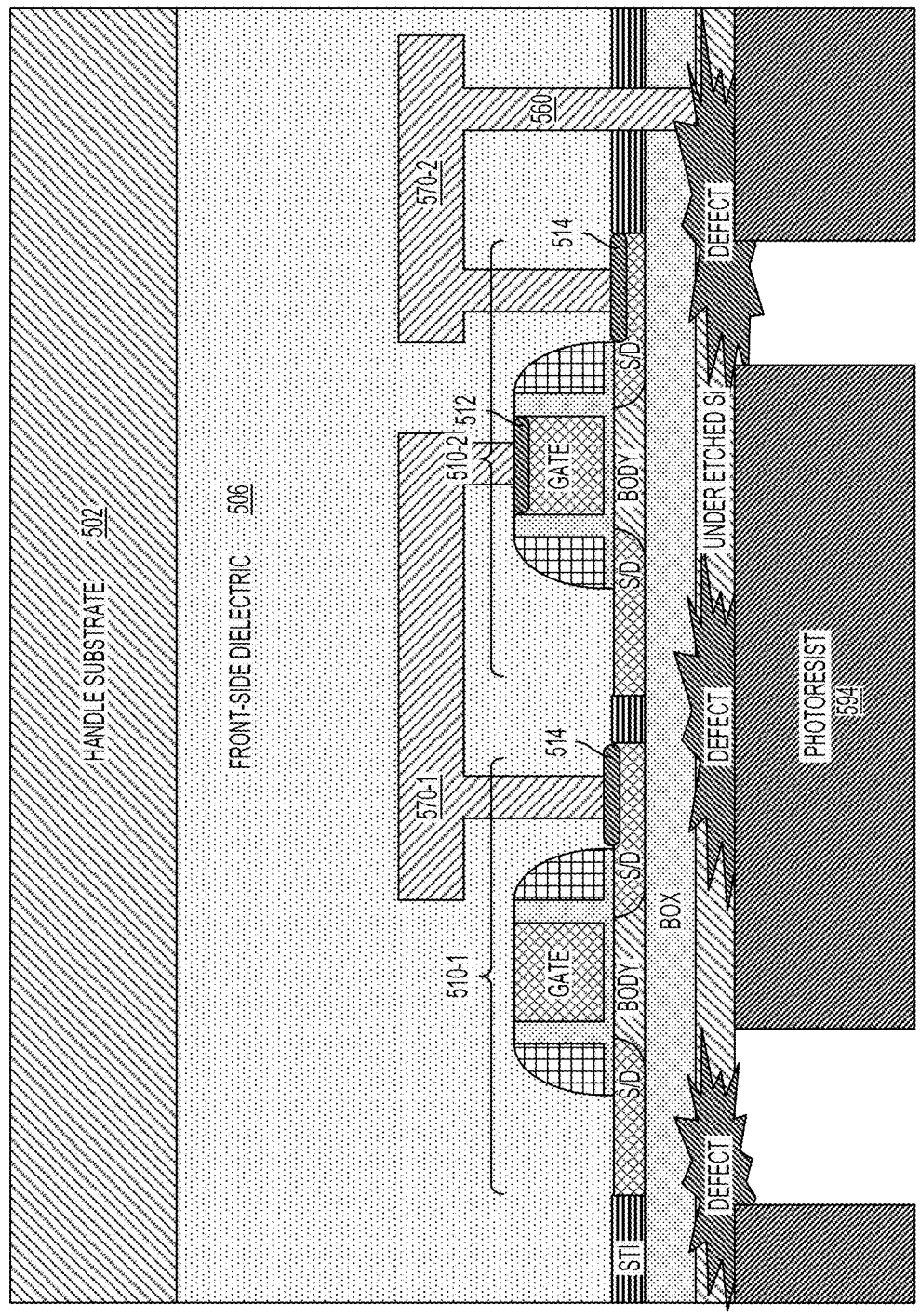
Figure 8E:
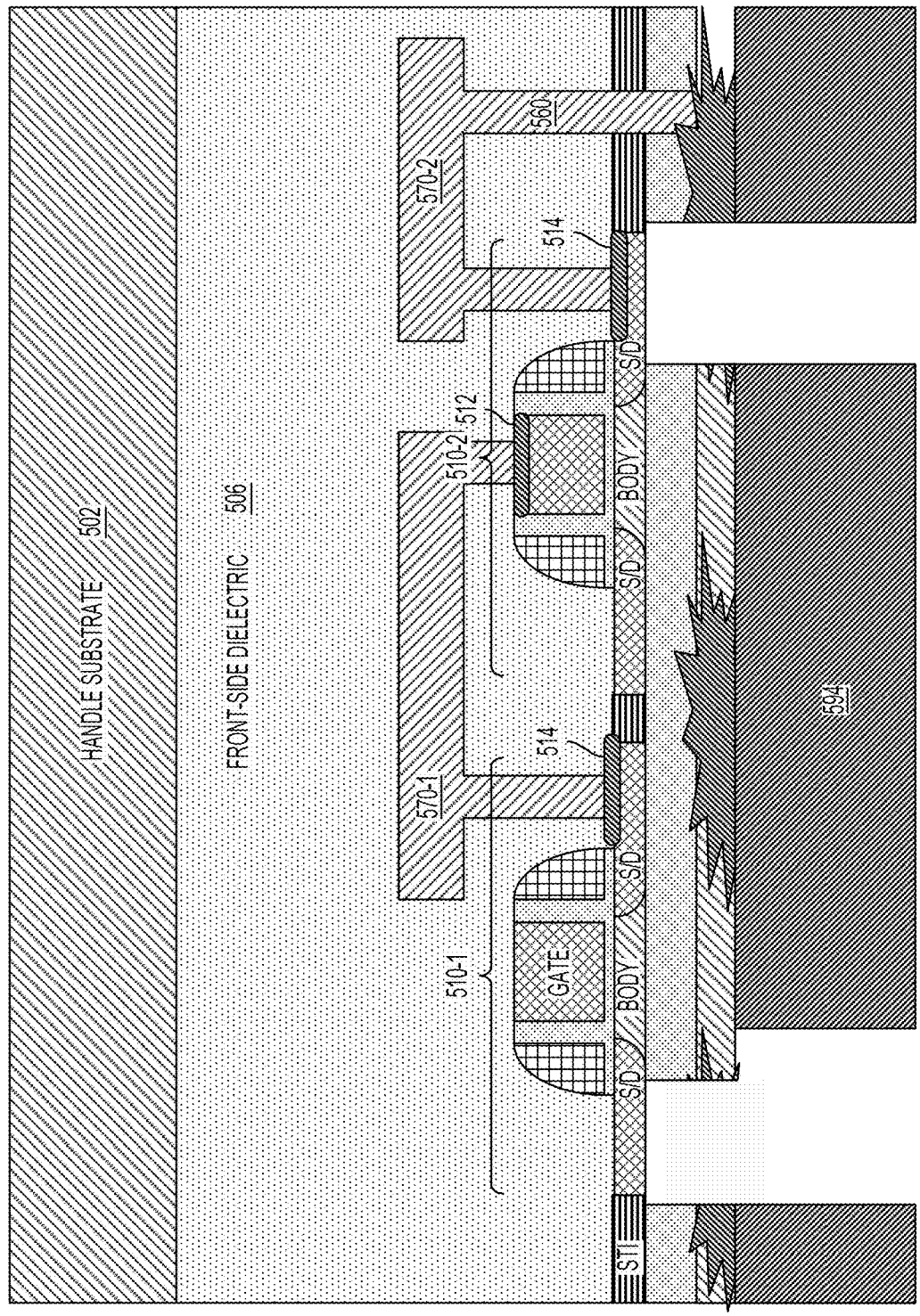

As shown in FIG. 8D, a post-layer transfer mask process is performed by depositing a photoresist 594 and exposing the implanted defects within, for example, an under etched semiconductor (e.g., silicon (Si)) layer. As shown in FIG. 8E, the process continues with etching of the backside dielectric layer 540 and the isolation layer 520 to expose a backside of the source/drain region of the first active device 510-1 and a backside of the source/drain regions of the second active device 510-2. In this aspect of the present disclosure, the implanted defects enable self-alignment between the source/drain/body regions of the active devices 510 and the backside extended source/drain/body regions. That is, the backside etching does not reach the gates. Alternatively, the implanted defects may provide an etch stop layer and reduce an etch rate to support the backside raised source/drain/body regions.

Figure 9:
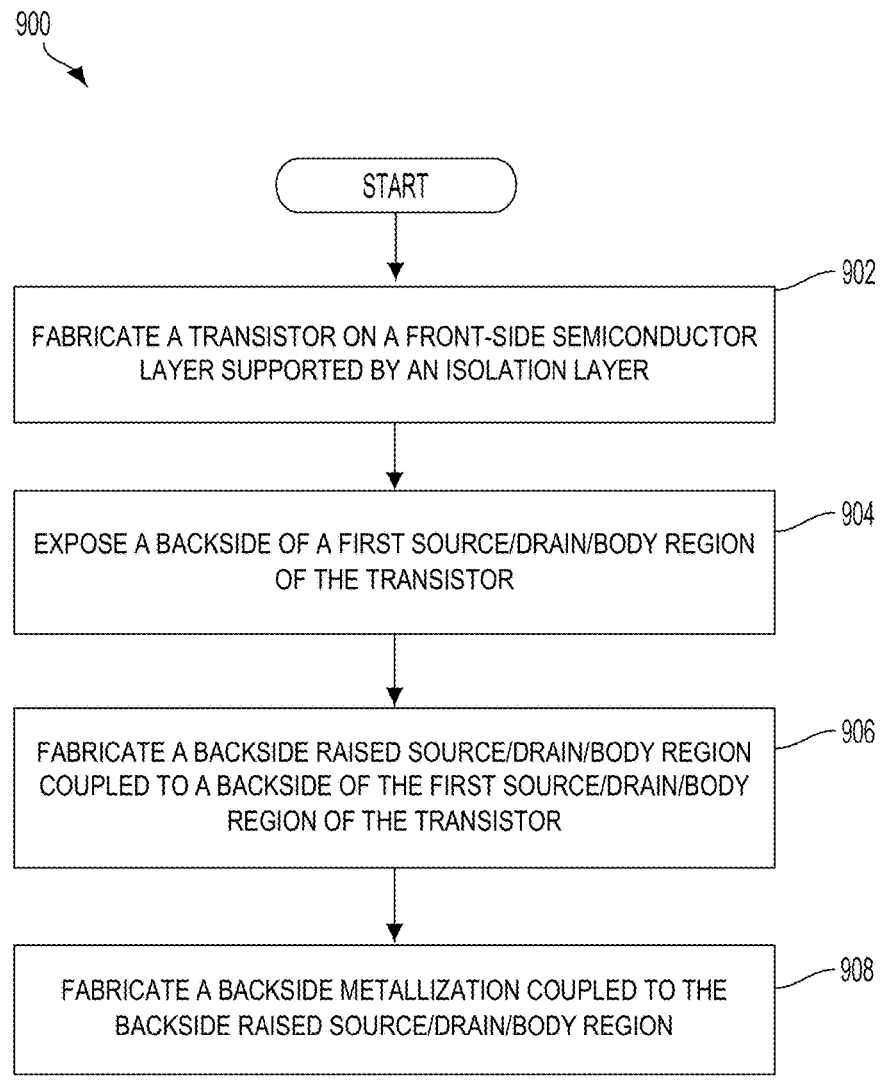
FIG. 9 is a process flow diagram illustrating a method of constructing an integrated circuit structure including an active device having backside extended source/drain/body regions according to an aspect of the present disclosure.

FIG. 9 is a process flow diagram illustrating a method 900 of constructing an integrated circuit structure, including an active device having backside extended source/drain/body regions, according to an aspect of the present disclosure. In block 902, a transistor is fabricated using a front-side semiconductor layer supported by an isolation layer. For example, as shown in FIG. 6A, the active device 310 is fabricated using a front-side semiconductor layer (e.g., a silicon on insulator (SOI) layer) supported by an isolation layer (e.g., a buried oxide (BOX) layer). In the configuration shown in FIGS. 6A to 6E, a front-side metallization is fabricated in a front-side dielectric layer on the active device. For example, as shown in FIG. 6A, a front-side metallization 570 is coupled to a front-side via 560 that extends through a shallow trench isolation (STI) region and an isolation layer 520. This portion of the process for fabricating the transistor is performed prior to a layer transfer process.

For example, a layer transfer process is performed, in which a handle substrate 502 is bonded to a front-side dielectric layer 506, as shown in FIG. 6A. The layer transfer process also includes removal of a sacrificial substrate. As shown in FIG. 3B, the layer-transfer process includes removal of the sacrificial substrate 301. In this aspect of the present disclosure, fabrication of raised backside source/drain/body regions is performed as part of a post layer-transfer process.

Referring again to FIG. 9, in block 904, a backside of a first source/drain/body region of the transistor is exposed. For example, as shown in FIG. 6B, a post-layer transfer raised source/drain/body formation process may begin with deposition of a backside dielectric layer 540 on the isolation layer 520. As shown in FIG. 6C, a backside of the source/drain regions of the active devices 510 are exposed. In block 906, a raised source/drain/body region is fabricated. For example, as shown 6D, raised source/drain (S/D) regions are coupled to a backside of the source/drain regions of the active device 510. The raised source/drain regions may extend from the backside of the source/drain regions toward the backside dielectric layer 540 supporting the isolation layer 520. Alternatively, a backside a of second source/drain/body region may be exposed to enable formation of another raised source/drain/body region.

According to aspects of the present disclosure, the raised source/drain/body regions may be epitaxially grown or fabricated as part of an amorphous deposition process. For example, as shown in FIG. 6D, an epitaxial growth process may include selectively growing a backside semiconductor layer on an exposed backside of the raised source/drain regions of the active devices 510. This epitaxial growth process also includes subjecting the backside semiconductor layer to an anneal process to form the raised source/drain regions. Once the raised source/drain regions are formed, etching of a surface of the backside dielectric layer 540 and/or the raised source/drain regions of the active devices 510 is performed. By providing backside raised source/drain regions that extend away from a front-side of the integrated circuit structure 500, parasitic capacitance between the transistor gate and conventional raised source/drain regions is avoided.

According to aspects of the present disclosure, a post-layer transfer growth/deposition process is described for formation of the backside raised source/drain/body regions. The post-layer transfer growth process may involve a pre-clean portion, a growth portion, and a post-deposition anneal. The post-deposition anneal may be a low temperature anneal (e.g., below 350°) or a short-local laser anneal. In addition, the backside raised source/drain/body region may or may not be of a single crystal structure. For example, the backside raised source/drain/body region may be formed by a fully amorphous deposition followed by solid phase epitaxy anneal to form a single crystal structure. Alternatively, in cases when a mono crystalline material is not desired, poly silicon, a silicon alloy, or other like semiconductor compound can be deposited to provide the backside semiconductor layer.

When an epitaxial growth process is used to form the backside semiconductor layer, a low temperature epitaxial growth may be performed using trisilane. Trisilane may permit the growth of a backside semiconductor layer (e.g., silicon) at lower temperatures below 350° C. due to a specific growth mechanism for enhancing H (hydrogen) desorption. By contrast, conventional semiconductor layers grown at temperatures lower than 500° C. are defective, irrespective of the carrier gas, pressure and precursor flow used. In addition, a thickness of the epitaxially grown backside semiconductor layer may be higher or lower than the surface of a wafer on which the layer is grown.

In block 908 of FIG. 9, a backside metallization is fabricated to couple to the raised source/drain regions. As shown in FIG. 6E, a backside contact 532 is deposited on the backside raised source/drain regions 530. In addition, a second backside dielectric layer 540-2 is deposited on the backside contact 532 and a first backside dielectric layer 540-1. Once deposited, the second backside dielectric layer 540-2 is patterned according to the backside contact 532. The second backside dielectric layer 540-2 is next etched (e.g., a dry plasma etch and clean process) to expose a portion of the backside contact 532. A backside metallization 550 is then deposited on the exposed portion of the backside contact 532 to contact the source/drain regions of the active devices 510.

According to a further aspect of the present disclosure, an integrated circuit structure including a transistor on a front-side semiconductor layer supported by an isolation layer is described. The transistor includes a first source/drain/body region. The integrated circuit structure may also include a means for extending a backside of the first source/drain/body region of the transistor from the isolation layer toward a backside dielectric layer supporting the isolation layer. The integrated circuit structure may further include a backside metallization coupled to the backside of first source/drain/body region through the extending means. The extending means may be the raised source/drain region, shown in FIGS. 5A and 5B. The extending means may also be the raised body region, shown in FIGS. 7D and 7E. In another aspect, the aforementioned means may be any module or any apparatus configured to perform the functions recited by the aforementioned means.

Unfortunately, successful fabrication of transistors using silicon on insulator (SOI) technology may involve the use of raised source/drain regions. Conventionally, a raised source/drain enables contact between the raised source/drain region and subsequent metallization layers. In addition, a raised source/drain region provides a channel for carriers to travel. Unfortunately, conventional transistors with raised source/drain regions generally suffer from the raised source/drain region problem. In addition, conventional CMOS technology is limited to epitaxial growth on the front-side of the active devices. As a result, aspects of the present disclosure include a post-layer transfer process to enable backside semiconductor deposition/growth to eliminate the raised source/drain region problem.

Aspects of the present disclosure describe integrated circuit structures including transistors having backside raised source/drain/body regions that may be used as antenna switch transistors in integrated radio frequency (RF) circuit structures for high quality (Q)-factor RF applications. In one configuration, a post layer-transfer metallization is used to form the backside raised source/drain/body regions of a transistor. The post-layer transfer process may form a backside semiconductor layer on a backside of the source/drain regions of a transistor. The backside semiconductor layer may extend from a first surface to a second surface of an isolation layer, in which a first surface of the isolation layer supports the transistor.

In this configuration, the post-layer transfer process may include a post-layer deposition process or a post-layer growth process for forming the backside semiconductor layers on the backside of the source/drain regions of the transistor. A subsequent anneal process is applied to the semiconductor layers to form backside raised source/drain regions of the transistor. In this configuration, the backside raised source/drain regions of the transistor may reduce the parasitic capacitance associated with front-side raised source/drain regions fabricated using conventional CMOS processes. That is, extension of the source/drain regions into a backside of the transistor helps prevent the formation of parasitic capacitance between the body of the transistor and conventional front-side raised source/drain regions.

Figure 10:
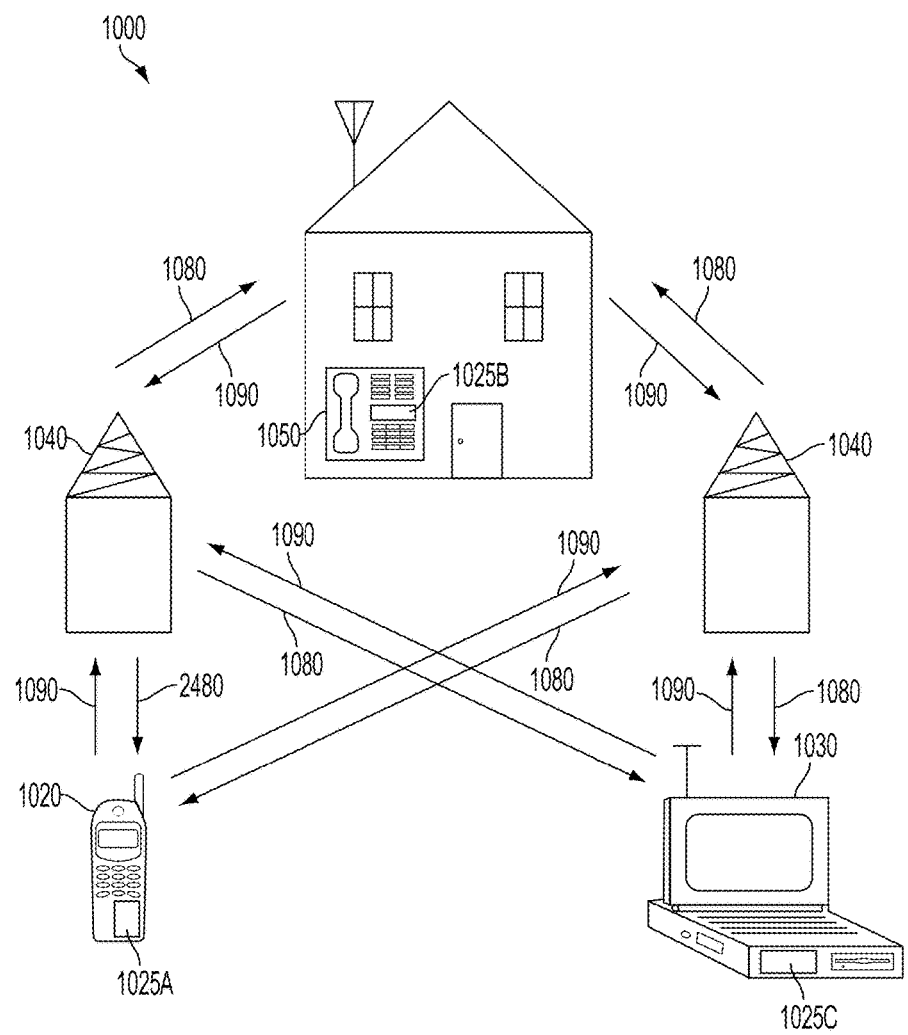
FIG. 10 is a block diagram showing an exemplary wireless communication system in which a configuration of the disclosure may be advantageously employed.

FIG. 10 is a block diagram showing an exemplary wireless communication system 1000 in which an aspect of the disclosure may be advantageously employed. For purposes of illustration, FIG. 10 shows three remote units 1020, 1030, and 1050 and two base stations 1040. It will be recognized that wireless communication systems may have many more remote units and base stations. Remote units 1020, 1030, and 1050 include IC devices 1025A, 1025C, and 1025B that include the disclosed backside semiconductor growth. It will be recognized that other devices may also include the disclosed backside semiconductor growth, such as the base stations, switching devices, and network equipment. FIG. 10 shows forward link signals 1080 from the base station 1040 to the remote units 1020, 1030, and 1050 and reverse link signals 1090 from the remote units 1020, 1030, and 1050 to base stations 1040.

In FIG. 10, remote unit 1020 is shown as a mobile telephone, remote unit 1030 is shown as a portable computer, and remote unit 1050 is shown as a fixed location remote unit in a wireless local loop system. For example, a remote units may be a mobile phone, a hand-held personal communication systems (PCS) unit, a portable data unit such as a personal digital assistant (PDA), a GPS enabled device, a navigation device, a set top box, a music player, a video player, an entertainment unit, a fixed location data unit such as a meter reading equipment, or other communications device that stores or retrieve data or computer instructions, or combinations thereof. Although FIG. 10 illustrates remote units according to the aspects of the disclosure, the disclosure is not limited to these exemplary illustrated units. Aspects of the disclosure may be suitably employed in many devices, which include the disclosed RF devices.

Figure 11:
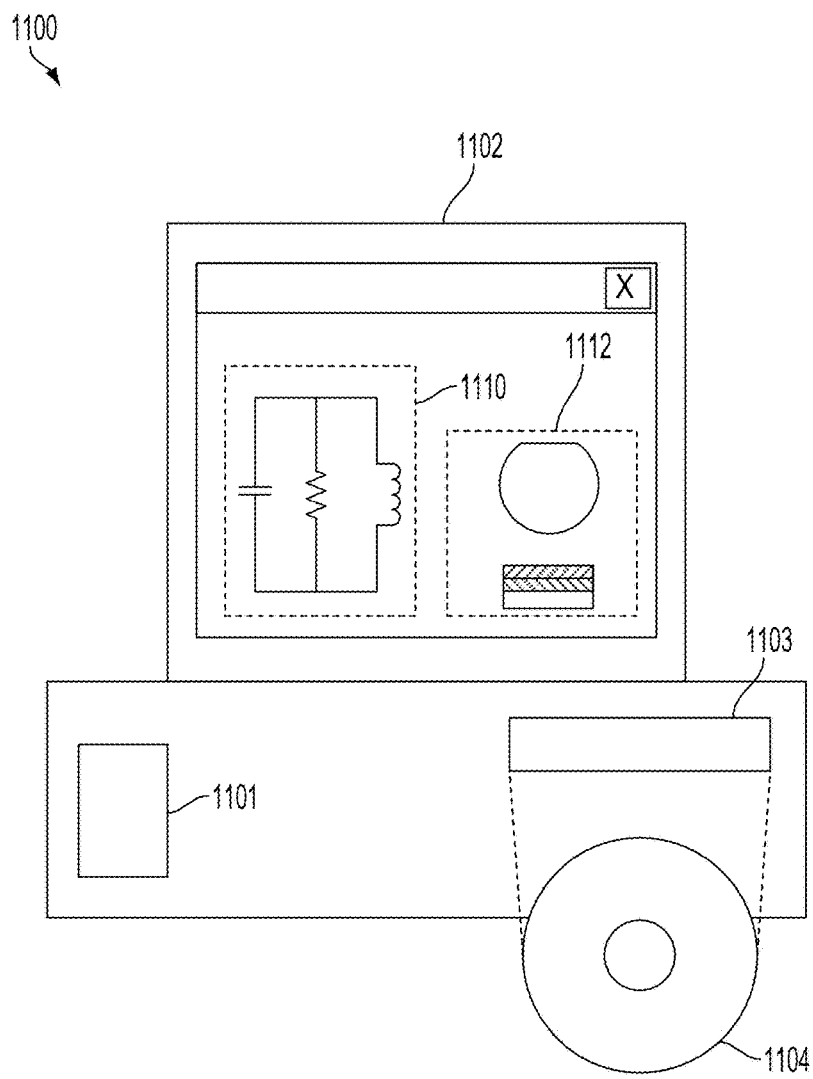
FIG. 11 is a block diagram illustrating a design workstation used for circuit, layout, and logic design of a semiconductor component according to one configuration.

FIG. 11 is a block diagram illustrating a design workstation used for circuit, layout, and logic design of a semiconductor component, such as the RF devices disclosed above. A design workstation 1100 includes a hard disk 1101 containing operating system software, support files, and design software such as Cadence or OrCAD. The design workstation 1100 also includes a display 1102 to facilitate design of a circuit 1110 or a semiconductor component 1112 such as an RF device. A storage medium 1104 is provided for tangibly storing the circuit design 1110 or the semiconductor component 1112. The circuit design 1110 or the semiconductor component 1112 may be stored on the storage medium 1104 in a file format such as GDSII or GERBER. The storage medium 1104 may be a CD-ROM, DVD, hard disk, flash memory, or other appropriate device. Furthermore, the design workstation 1100 includes a drive apparatus 1103 for accepting input from or writing output to the storage medium 1104.

Data recorded on the storage medium 1104 may specify logic circuit configurations, pattern data for photolithography masks, or mask pattern data for serial write tools such as electron beam lithography. The data may further include logic verification data such as timing diagrams or net circuits associated with logic simulations. Providing data on the storage medium 1104 facilitates the design of the circuit design 1110 or the semiconductor component 1112 by decreasing the number of processes for designing semiconductor wafers.

For a firmware and/or software implementation, the methodologies may be implemented with modules (e.g., procedures, functions, and so on) that perform the functions described herein. A machine-readable medium tangibly embodying instructions may be used in implementing the methodologies described herein. For example, software codes may be stored in a memory and executed by a processor unit. Memory may be implemented within the processor unit or external to the processor unit. As used herein, the term "memory" refers to types of long term, short term, volatile, nonvolatile, or other memory and is not to be limited to a particular type of memory or number of memories, or type of media upon which memory is stored.

If implemented in firmware and/or software, the functions may be stored as one or more instructions or code on a computer-readable medium. Examples include computer-readable media encoded with a data structure and computer-readable media encoded with a computer program. Computer-readable media includes physical computer storage media. A storage medium may be an available medium that can be accessed by a computer. By way of example, and not limitation, such computer-readable media can include RAM, ROM, EEPROM, CD-ROM or other optical disk storage, magnetic disk storage or other magnetic storage devices, or other medium that can be used to store desired program code in the form of instructions or data structures and that can be accessed by a computer; disk and disc, as used herein, includes compact disc (CD), laser disc, optical disc, digital versatile disc (DVD), floppy disk and Blu-ray disc where disks usually reproduce data magnetically, while discs reproduce data optically with lasers. Combinations of the above should also be included within the scope of computer-readable media.

In addition to storage on computer readable medium, instructions and/or data may be provided as signals on transmission media included in a communication apparatus. For example, a communication apparatus may include a transceiver having signals indicative of instructions and data. The instructions and data are configured to cause one or more processors to implement the functions outlined in the claims.

Although the present disclosure and its advantages have been described in detail, it should be understood that various changes, substitutions and alterations can be made herein without departing from the technology of the disclosure as defined by the appended claims. For example, relational terms, such as "above" and "below" are used with respect to a substrate or electronic device. Of course, if the substrate or electronic device is inverted, above becomes below, and vice versa. Additionally, if oriented sideways, above and below may refer to sides of a substrate or electronic device. Moreover, the scope of the present application is not intended to be limited to the particular configurations of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed that perform substantially the same function or achieve substantially the same result as the corresponding configurations described herein may be utilized according to the present disclosure. Accordingly, the appended claims are intended to include within their scope such processes, machines, manufacture, compositions of matter, means, methods, or steps.

What is claimed is:

1. An integrated circuit structure, comprising:
a transistor on a front-side semiconductor layer supported by an isolation layer, the transistor including a first source/drain region and a body region in the front-side semiconductor layer;
a raised source/drain region coupled to a backside of the first source/drain region of the transistor, the raised source/drain region extending from the backside of the first source/drain region toward a backside dielectric layer supporting the isolation layer;
a raised body region coupled to a backside of the body region of the transistor, the raised body region extending from the backside of the body region toward the backside dielectric layer; and
a backside metallization coupled to the raised source/drain region and/or the raised body region of the transistor.

2. The integrated circuit structure of claim 1, in which the raised source/drain region is comprised of an epitaxially grown, backside semiconductor material.

3. The integrated circuit structure of claim 1, further comprising a front-side metallization coupled to a second source/drain region of the transistor, the front-side metallization being distal from the backside metallization.

4. The integrated circuit structure of claim 3, in which the front-side metallization comprises a front-side back-end-of-line (BEOL) interconnect within a front-side dielectric layer and coupled to a front-side contact on the second source/drain region of the transistor; and
the backside metallization comprises a backside BEOL interconnect within the backside dielectric layer and including a first portion coupled to a backside contact on the raised source/drain region of the transistor, and a second portion coupled to the front-side BEOL interconnect.

5. The integrated circuit structure of claim 3, in which the front-side metallization comprises a back-end-of-line (BEOL) interconnect coupled to a front-side contact on the second source/drain region of the transistor, the BEOL interconnect within a front-side dielectric layer.

6. The integrated circuit structure of claim 1, in which the transistor comprises a radio frequency (RF) switch.

7. The integrated circuit structure of claim 1, in which the raised source/drain region is doped with a dopant different than a dopant of the first source/drain region of the transistor.

8. The integrated circuit structure of claim 1, in which the raised source/drain region is self-aligned with the first source/drain region of the transistor.

9. The integrated circuit structure of claim 1, in which the raised source/drain region of the transistor extends through the isolation layer and into the backside dielectric layer.

10. The integrated circuit structure of claim 1, integrated into a radio frequency (RF) front end module, the RF front end module incorporated into at least one of a music player, a video player, an entertainment unit, a navigation device, a communications device, a personal digital assistant (PDA), a fixed location data unit, a mobile phone, and a portable computer.

11. A method of constructing an integrated circuit structure, comprising:
fabricating a transistor using a front-side semiconductor layer supported by an isolation layer, the transistor including a first source/drain region and a body region;
exposing a backside of the first source/drain region and a backside of the body region;
fabricating a raised source/drain region coupled to the backside of the first source/drain region of the transistor, the raised source/drain region extending from the backside of the first source/drain region toward a first backside dielectric layer supporting the isolation layer;
fabricating a raised body region coupled to a backside of the body region of the transistor, the raised body region extending from the backside of the body region toward the backside dielectric layer; and
fabricating a backside metallization coupled to the raised source/drain region and/or the raised body region of the transistor.

12. The method of claim 11, in which fabricating the raised source/drain region comprises:
implanting ions in at least the first backside dielectric layer supporting the isolation layer, in which the implanting is performed from a front-side of the integrated circuit structure;
patterning the first backside dielectric layer according to implanted defects in the first backside dielectric layer, the implanted defects being proximate to the backside of the first source/drain region of the transistor; and
exposing the backside of the first source/drain region of the transistor through the first backside dielectric layer and the isolation layer.

13. The method of claim 11, in which fabricating the raised source/drain region comprises selectively growing a backside semiconductor layer on the backside of the first source/drain region of the transistor.

14. The method of claim 13, further comprising annealing the backside semiconductor layer to form the raised source/drain region.

15. The method of claim 11, further comprising:
depositing a backside silicide on the raised source/drain region; and
depositing a second backside dielectric layer on the backside silicide and the first backside dielectric layer.

16. The method of claim 11, in which fabricating the raised source/drain region comprises depositing a backside semiconductor layer on an exposed portion of the backside of the first source/drain region.

17. The method of claim 11, further comprising integrating the integrated circuit structure into a radio frequency (RF) front end module, the RF front end module incorporated into at least one of a music player, a video player, an entertainment unit, a navigation device, a communications device, a personal digital assistant (PDA), a fixed location data unit, a mobile phone, and a portable computer.

18. An integrated circuit structure, comprising:
a transistor on a front-side semiconductor layer supported by an isolation layer, the transistor including a first source/drain region and a body region;
means for extending a backside of the first source/drain region of the transistor from the isolation layer toward a backside dielectric layer supporting the isolation layer;
means for extending a backside of the body region of the transistor from the isolation layer toward the backside dielectric layer; and
a backside metallization coupled to the backside of the first source/drain region through the extending means for the first source/drain region and/or the backside of the body region through the extending means for the body region of the transistor.

19. The integrated circuit structure of claim 18, further comprising a front-side metallization coupled to a second source/drain region of the transistor, the front-side metallization being distal from the backside metallization.

20. The integrated circuit structure of claim 19, in which the front-side metallization comprises a back-end-of-line (BEOL) interconnect coupled to a front-side contact on the second source/drain region of the transistor, the BEOL interconnect within a front-side dielectric layer.

21. The integrated circuit structure of claim 19, in which the front-side metallization comprises a front-side back-end-of-line (BEOL) interconnect within a front-side dielectric layer and coupled to a front-side contact on the second source/drain region of the transistor; and the backside metallization comprises a backside BEOL interconnect within the backside dielectric layer and including a first portion coupled to a backside contact on the raised source/drain region of the transistor, and a second portion coupled to the front-side BEOL interconnect.

22. The integrated circuit structure of claim 18, in which the transistor comprises an RF switch.

23. The integrated circuit structure of claim 18, in which the extending means is self-aligned with the first source/drain region of the transistor.

24. The integrated circuit structure of claim 18, integrated into a radio frequency (RF) front end module, the RF front end module incorporated into at least one of a music player, a video player, an entertainment unit, a navigation device, a communications device, a personal digital assistant (PDA), a fixed location data unit, a mobile phone, and a portable computer.

25. A radio frequency (RF) front end module, comprising:
an integrated RF circuit structure, comprising a switch transistor on a front-side semiconductor layer supported by an isolation layer, the switch transistor including a first source/drain region, a body region in the front-side semiconductor layer, a raised source/drain region coupled to a backside of the first source/drain region of the switch transistor, in which the raised source/drain region extends from the backside of the first source/drain region toward a backside dielectric layer supporting the isolation layer, a raised body region coupled to a backside of the body region of the transistor, the raised body region extending from the backside of the body region toward the backside dielectric layer, and a backside metallization coupled to the raised source/drain region and/or the raised body region of the transistor; and an antenna coupled to an output of the switch transistor.

26. The RF front end module of claim 25, in which the raised source/drain region is comprised of an epitaxially grown, backside semiconductor material.

27. The RF front end module of claim 25, in which the raised source/drain region is doped with a dopant different than a dopant of the first source/drain region of the switch transistor.

28. The RF front end module of claim 25, in which the raised source/drain region of the transistor extends through the isolation layer and into the backside dielectric layer.

29. The RF front end module of claim 25, incorporated into at least one of a music player, a video player, an entertainment unit, a navigation device, a communications device, a personal digital assistant (PDA), a fixed location data unit, a mobile phone, and a portable computer.

30. The RF front end module of claim 25, further comprising a front-side metallization comprises a front-side back-end-of-line (BEOL) interconnect within a front-side dielectric layer and coupled to a front-side contact on the second source/drain region of the transistor; in which
the backside metallization comprises a backside BEOL interconnect within the backside dielectric layer and including a first portion coupled to a backside contact on the raised source/drain region of the transistor, and a second portion coupled to the front-side BEOL interconnect.

* * * * *